US012078857B2

(12) United States Patent
Zhang et al.

(10) Patent No.: US 12,078,857 B2
(45) Date of Patent: Sep. 3, 2024

(54) INTEGRATED GERMANIUM PHOTODETECTOR WITH SILICON NITRIDE LAUNCH WAVEGUIDE

(71) Applicant: Alpine Optoelectronics, Inc., Fremont, CA (US)

(72) Inventors: Xingyu Zhang, Fremont, CA (US); Dawei Zheng, Fremont, CA (US); Tongqing Wang, Fremont, CA (US)

(*) Notice: Subject to any disclaimer, the term of this patent is extended or adjusted under 35 U.S.C. 154(b) by 488 days.

(21) Appl. No.: 17/443,293

(22) Filed: Jul. 23, 2021

(65) Prior Publication Data

US 2022/0283391 A1 Sep. 8, 2022

Related U.S. Application Data

(60) Provisional application No. 63/158,286, filed on Mar. 8, 2021.

(51) Int. Cl.
*G02B 6/42* (2006.01)
*G02B 6/293* (2006.01)
(Continued)

(52) U.S. Cl.
CPC ....... *G02B 6/4298* (2013.01); *G02B 6/29344* (2013.01); *G02B 6/4215* (2013.01);
(Continued)

(58) Field of Classification Search
CPC .......... G02B 6/4298; G02B 6/29344; G02B 6/4215; G02B 6/1228; G02B 2006/12061;
(Continued)

(56) References Cited

U.S. PATENT DOCUMENTS

2013/0114924 A1* 5/2013 Loh .............. G02B 6/12
385/33
2016/0204285 A1* 7/2016 Chen ............ H01L 31/18
257/432
(Continued)

OTHER PUBLICATIONS

Guoliang Li, et al., Improving CMOS-compatible Germanium photodetectors, Optics Express, (2012), pp. 26345-26350, vol. 20, Issue 24, The Optical Society.
(Continued)

*Primary Examiner* — Sitaramarao S Yechuri
(74) *Attorney, Agent, or Firm* — CIONCA IP Law P.C.

(57) ABSTRACT

An optical apparatus comprising an integrated germanium photodetector associated with a silicon nitride launch waveguide, the integrated germanium photodetector comprising a silicon layer, a germanium layer disposed atop the silicon layer, a plurality of conductive vias, at least one conductive via of the plurality of conductive vias being disposed atop the germanium layer, and a plurality of metal contacts each interconnected to each of the plurality of conductive vias; wherein the silicon nitride launch waveguide extends over a length of the silicon layer, and such that to create a coupling region between the silicon nitride launch waveguide and the germanium layer; and wherein, when an optical signal is launched into the silicon nitride launch waveguide, the optical signal is caused to be coupled into the integrated germanium photodetector at the coupling region, such that to be absorbed by the germanium layer.

17 Claims, 8 Drawing Sheets

(51) Int. Cl.
  *H01L 31/0232* (2014.01)
  *H01L 31/0224* (2006.01)
  *H01L 31/028* (2006.01)
(52) U.S. Cl.
  CPC ............................ *H01L 31/02327* (2013.01);
       *H01L 31/022408* (2013.01); *H01L 31/028*
                                                  (2013.01)
(58) Field of Classification Search
  CPC .... G02B 2006/12123; H01L 31/02327; H01L
                          31/022408; H01L 31/028
  See application file for complete search history.

(56) References Cited

U.S. PATENT DOCUMENTS

2019/0324210 A1* 10/2019 Sakib ..................... H01S 5/141
2021/0157068 A1*  5/2021 Gothoskar ........ H01L 31/03529
2022/0229228 A1*  7/2022 Coolbaugh ....... H01L 31/02161

OTHER PUBLICATIONS

Matthew Byrd, et al. Mode-evolution-based coupler for high saturation power Ge-on-Si photodetectors, Optics Letters, (2017) pp. 851-854, vol. 42, Issue 4, Optics Letters.

* cited by examiner

INTEGRATED GERMANIUM PHOTODETECTOR WITH SILICON NITRIDE LAUNCH WAVEGUIDE

CROSS-REFERENCE TO RELATED APPLICATIONS

This application claims the benefit of U.S. Provisional Application No. 63/158,286, filed Mar. 8, 2021, which is hereby incorporated by reference, to the extent that it is not conflicting with the present application.

BACKGROUND OF INVENTION

1. Field of the Invention

The invention relates generally to integrated photodetectors on silicon photonics chips, and more specifically to integrated germanium photodetectors having a silicon nitride launch waveguide on silicon photonics chips.

2. Description of the Related Art

In the field of integrated silicon photonics, CMOS-compatible (i.e., compatible with the standard flow of silicon photonics foundries) integrated germanium photodetectors (Ge PDs) have been widely used and adapted for highspeed optical-to-electrical (OE) conversion, power monitoring, and many other applications. In a typical germanium photodetector, a germanium layer is epitaxially grown atop a silicon (Si) layer on a silicon-on-insulator (SOI) substrate, for example. The top silicon layer may conventionally be provided in a thickness between 220 nanometers (nm) and 250 nm, as an example. Below the silicon layer, a buried oxide layer (approximately 2-3 micrometers (μm) thick) and a silicon handle (approximately 750 μm thick) may each be provided. Depending on the design of the Ge PD implantation used to form a P-I-N junction, for example, as well as the chosen metal contact (e.g., tungsten (W) vias and aluminum (Al) electrodes) arrangements, the Ge PDs can be generally categorized into two groups: lateral PDs and vertical PDs.

Currently, existing Ge PDs rely on butt coupling a silicon waveguide to a Ge PD to effectively launch optical light into the Ge PD, as an example, for either lateral PDs or vertical PDs. Typically, the silicon waveguide is tapered (in shape), such that to expand the optical mode size and thus match the width of the Ge PD for direct launching of optical light into a front of the Ge PD, for example. Other approaches involve evanescently coupling optical light through a silicon waveguide disposed to a side of the Ge PD, rather than butt-coupled to the front, for example.

However, the above-described approaches for either lateral PDs or vertical PDs possess some shortcomings. As an example, a silicon waveguide is known to have strong absorption capabilities at the visible light range, rendering the material ineffective for visible light detection of photodetectors, which may thus limit the applications of Ge PDs that rely on silicon waveguides. Additionally, silicon waveguides may show high propagation loss and low power handling capability along certain ranges, proving a need for much improvement, particularly for applications involving optical signals having high levels of launch power or employing low-loss receiver design.

Therefore, there is a need to solve the problems described above by providing an effective and efficient CMOS-compatible integrated germanium photodetector, having a silicon nitride launch waveguide, and method, for evanescently coupling optical light into the integrated germanium photodetector.

The aspects or the problems and the associated solutions presented in this section could be or could have been pursued; they are not necessarily approaches that have been previously conceived or pursued. Therefore, unless otherwise indicated, it should not be assumed that any of the approaches presented in this section qualify as prior art merely by virtue of their presence in this section of the application.

BRIEF INVENTION SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an aspect, an optical apparatus comprising an integrated germanium photodetector associated with a silicon nitride launch waveguide is provided. The integrated germanium photodetector may comprise: a silicon layer; a germanium layer disposed atop the silicon layer; a first and a second conductive vias, the first conductive via being disposed atop the germanium layer and the second conductive via being disposed parallelly atop the silicon layer; and a first and a second metal contacts interconnected to the first and the second conductive vias, respectively; wherein the silicon nitride launch waveguide extends over a length of the silicon layer, and such that to create a coupling region between the silicon nitride launch waveguide and the germanium layer, the silicon nitride launch waveguide comprising an optical reflector; and wherein, when an optical signal is launched into a first end of the silicon nitride launch waveguide, the optical signal is caused to propagate along the silicon nitride launch waveguide toward the integrated germanium photodetector, the optical signal being coupled into the integrated germanium photodetector at the coupling region, such that to be absorbed by the germanium layer. Thus, an advantage of the disclosed integrated germanium photodetector is that optical light may be effectively absorbed and converted to an electrical signal readable by an external device. Another advantage of the disclosed integrated germanium photodetector with silicon nitride waveguide is the enabling of matched TE and TM polarized light group delays, which is beneficial for polarization-insensitive receivers in certain polarization-division-multiplexing applications. An additional advantage is that silicon nitride waveguides usually show lower propagation loss on an optical signal than silicon waveguides, which is also beneficial for sensitive receivers. Another advantage of using silicon nitride launch waveguide is that the disclosed integrated germanium photodetector may be used for visible light detection. An advantage of using a reflector with the silicon nitride launch waveguide is that the required length of the integrated germanium photodetector may be reduced, which may thus reduce costs associated with manufacturing the integrated germanium photodetector. An additional advantage is that, because the integrated germanium photodetector length may be reduced, the dark current of the photodetector may also be reduced. An additional advantage is that, because the integrated germanium photodetector length may be reduced, the device's RF bandwidth may be increased, which may benefit high-speed optical applications. Another advantage is that the disclosed silicon nitride waveguide may enable optical light to be evanescently coupled into, and thus absorbed by, either vertical or lateral integrated germanium photodetector varieties.

In another aspect, an optical apparatus comprising an integrated germanium photodetector associated with a silicon nitride launch waveguide is provided. The integrated germanium photodetector may comprise: a silicon layer; a germanium layer disposed atop the silicon layer; a plurality of conductive vias, at least one conductive via of the plurality of conductive vias being disposed atop the germanium layer; and a plurality of metal contacts each interconnected to each of the plurality of conductive vias; wherein the silicon nitride launch waveguide extends over a length of the silicon layer, and such that to create a coupling region between the silicon nitride launch waveguide and the germanium layer; and wherein, when an optical signal is launched into the silicon nitride launch waveguide, the optical signal is caused to be coupled into the integrated germanium photodetector at the coupling region, such that to be absorbed by the germanium layer. Thus, an advantage of the disclosed integrated germanium photodetector is that optical light may be effectively absorbed and converted to an electrical signal readable by an external device. Another advantage of the disclosed integrated germanium photodetector with silicon nitride waveguide is the enabling of matched TE and TM polarized light group delays, which is beneficial for polarization-insensitive receivers in certain polarization-division-multiplexing applications. An additional advantage is that silicon nitride waveguides usually show lower propagation loss on an optical signal than silicon waveguides, which is also beneficial for sensitive receivers. Another advantage of using silicon nitride launch waveguide is that the disclosed integrated germanium photodetector may be used for visible light detection. Another advantage is that the disclosed silicon nitride waveguide may enable optical light to be evanescently coupled into, and thus absorbed by, either vertical or lateral integrated germanium photodetector varieties.

In another aspect, a method of integrating an optical apparatus onto an optical waveguide of an integrated photonics chip is provided. The method may comprise the steps of: depositing a germanium layer having a thickness atop the silicon layer of a silicon-on-insulator (SOI) substrate, which consist of a silicon handle, a buried oxide layer and a top silicon layer; providing a plurality of conductive vias, at least one conductive via of the plurality of conductive vias being disposed atop the germanium layer; interconnecting each of a plurality of metal contacts to each of the plurality of conductive vias; and providing a silicon nitride launch waveguide atop the buried oxide layer, the silicon nitride launch waveguide being positioned parallelly adjacent to, and a selected distance away from, a side of the silicon layer, the silicon nitride launch waveguide selectively extending over a length of the silicon layer, and such that at least a portion of the silicon nitride launch waveguide side-overlaps with at least a portion of the germanium layer to enhance the optical coupling between the silicon nitride waveguide and the germanium layer. Thus, an advantage of the disclosed integrated germanium photodetector with silicon nitride waveguide is the enabling of matched TE and TM polarized light group delays, which is beneficial for polarization-insensitive receivers in certain polarization-division-multiplexing applications. An additional advantage is that silicon nitride waveguides usually show lower propagation loss on an optical signal than silicon waveguides, which is also beneficial for sensitive receivers. Another advantage of using silicon nitride launch waveguide is that the disclosed integrated germanium photodetector may be used for visible light detection. Another advantage is that the disclosed silicon nitride waveguide may enable optical light to be evanescently coupled into, and thus absorbed by, either vertical or lateral integrated germanium photodetector varieties.

The above aspects or examples and advantages, as well as other aspects or examples and advantages, will become apparent from the ensuing description and accompanying drawings.

BRIEF DESCRIPTION OF THE DRAWINGS

For exemplification purposes, and not for limitation purposes, aspects, embodiments or examples of the invention are illustrated in the figures of the accompanying drawings, in which.

DETAILED DESCRIPTION

Figure 1A:
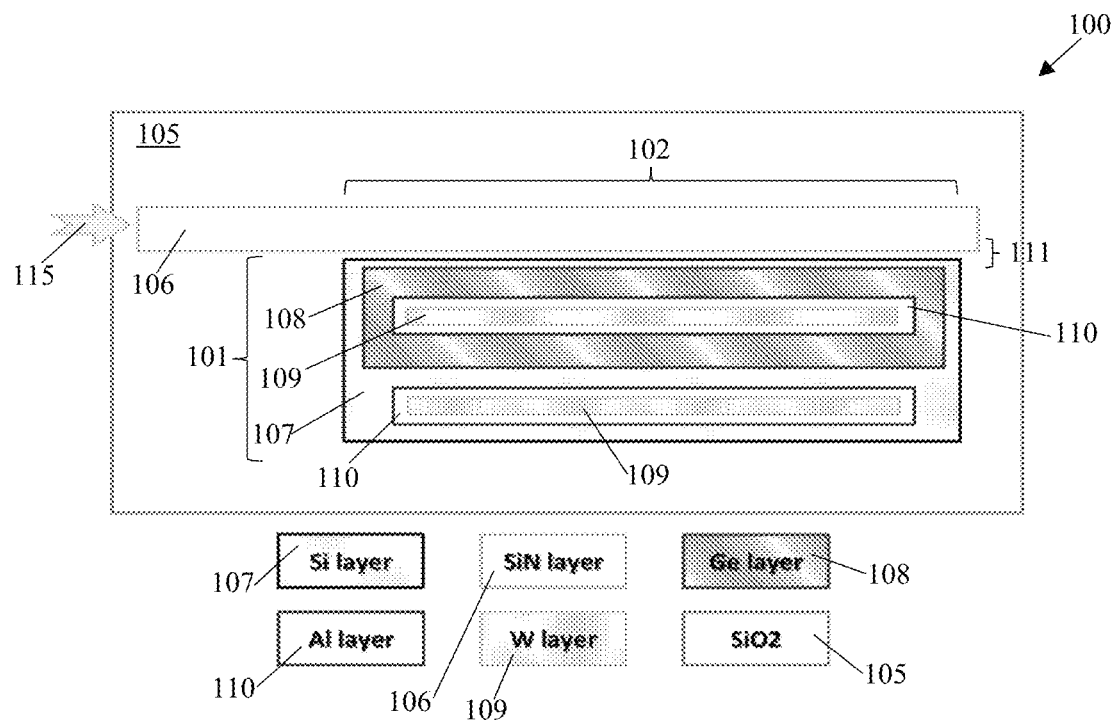
FIGS. 1A-1B are diagrams illustrating a top view and a front elevation cross-sectional view, respectively, of an optical apparatus comprising an integrated germanium photodetector and a silicon nitride launch waveguide, according to an aspect.

What follows is a description of various aspects, embodiments and/or examples in which the invention may be practiced. Reference will be made to the attached drawings, and the information included in the drawings is part of this detailed description. The aspects, embodiments and/or examples described herein are presented for exemplification purposes, and not for limitation purposes. It should be understood that structural and/or logical modifications could be made by someone of ordinary skills in the art without departing from the scope of the invention. Therefore, the scope of the invention is defined by the accompanying claims and their equivalents.

It should be understood that, for clarity of the drawings and of the specification, some or all details about some structural components or steps that are known in the art are not shown or described if they are not necessary for the invention to be understood by one of ordinary skills in the art.

For the following description, it can be assumed that most correspondingly labeled elements across the figures (e.g., 101 and 201, etc.) possess the same characteristics and are subject to the same structure and function. If there is a difference between correspondingly labeled elements that is not pointed out, and this difference results in a non-corresponding structure or function of an element for a particular embodiment, example or aspect, then the conflicting description given for that particular embodiment, example or aspect shall govern.

Figure 1B:
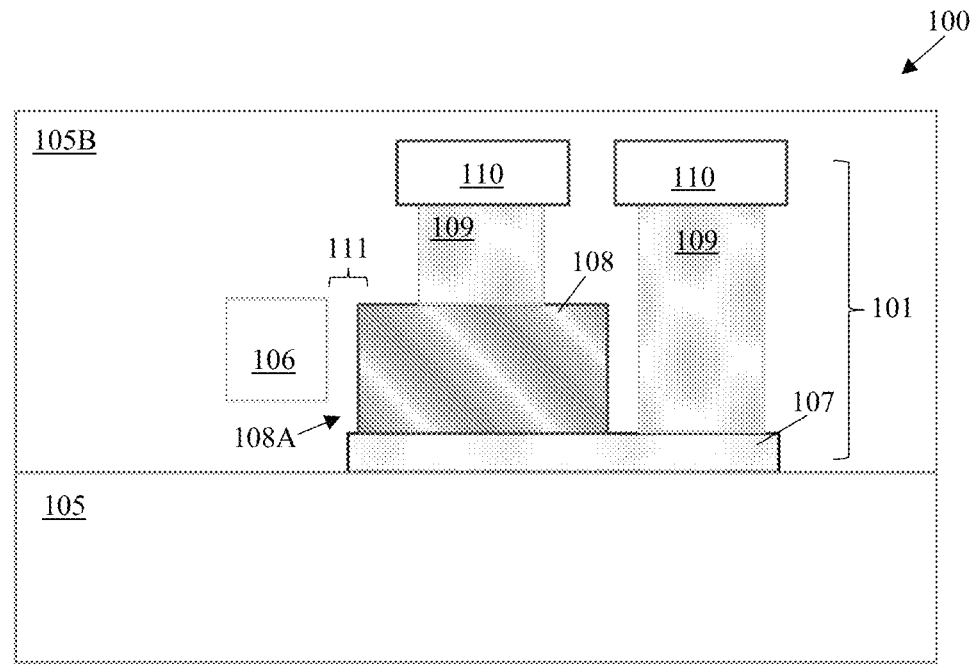

FIGS. 1A-1B are diagrams illustrating a top view and a front elevation cross-sectional view, respectively, of an optical apparatus 100 comprising an integrated germanium photodetector 101 and a silicon nitride launch waveguide 106, according to an aspect. As described previously in the Background above, conventional integrated germanium photodetectors may be provided with a silicon launch waveguide, disposed at either a front of the germanium photodetector or to a side of the germanium photodetector, for directly or evanescently coupling optical light into a given germanium photodetector, respectively, for example. As will be described in detail throughout this disclosure below, the integrated germanium photodetector of the present invention may be provided with a silicon nitride launch waveguide (collectively, "optical apparatus") for evanescently coupling optical light into the integrated germanium photodetector, as an example.

As shown in FIGS. 1A-1B, the optical apparatus 101 may comprise the integrated germanium photodetector ("integrated germanium photodetector," "germanium photodetector," "Ge PD," "integrated Ge PD") 101 having a plurality of exemplary layers deposited atop one another, for example, such that to form a stack or column of layers, as an example. It should be understood, as will be discussed in more detail below, that the exemplary plurality of layers shown in FIGS. 1A-1B may be provided directly or indirectly on an optical channel (not shown) of a silicon photonics chip, as an example. As shown in FIGS. 1A-1B, the integrated Ge PD 101 may comprise a buried oxide layer 105 and a top oxide layer 105B, each constructed of silicon dioxide (SiO$_2$), as indicated, for example, provided at a bottom or base of the integrated Ge PD 101 and surrounding the Ge PD 101, respectively. As shown, atop the buried silicon dioxide layer 105, a silicon (Si) layer 107 may be provided, which may have a user-selected thickness, as shown in FIG. 1B. Furthermore, a germanium layer 108 may be provided atop the Si layer 107, as shown, and may also comprise a user-selected thickness, as shown in FIG. 1B. As shown in FIGS. 1A-1B, a pair of tungsten (W) vias 109 may be parallelly provided in the germanium photodetector 101. As shown as an example, a first W via of the pair of W vias 109 may be deposited atop the Ge layer 108, and a second W via of the pair of W vias 109 may be deposited adjacently beside the Ge layer 108, where the second W via has a greater thickness/height than the first W via, as shown in FIG. 1B. Finally, as shown, an aluminum (Al) electrode 110 may be interconnected atop each tungsten via 109, such that to provide the Ge PD 101 with a metal contact. As an example, the Ge layer 108 is implanted such that a P-I-N junction-based diode (not shown) may be formed within. As will be discussed in more detail below, the aluminum electrodes 110 may be adapted to receive a voltage (via external electrical means, such as wires, for example), such that to reverse-bias the Ge P-I-N junction-based diode (not shown), as an example. Thus, as similarly mentioned previously in the Background above, the Ge PD 101 provides the optical-to-electrical conversion capability for a propagating optical signal, as will be described in more detail later.

As mentioned previously above, the optical apparatus 101 may further comprise a silicon nitride launch waveguide for evanescently coupling optical light into the Ge PD 101, as an example. As shown in FIGS. 1A-1B, the silicon nitride launch waveguide core 106, surrounded with SiO$_2$ cladding (via 105B), may be provided parallelly to a side 108A of the Ge layer 108, as an example. As shown in FIG. 1A, the SiN launch waveguide/layer 106 may extend a length greater than that of the Si layer 107 along the silicon dioxide layer 105, as an example, such that to create a side-overlapping coupling region/portion 102, having a length, between the SiN layer 106 and the Ge layer 108. As shown in FIG. 1B, the thicknesses and vertical locations (along a vertical y-axis, for example) of the SiN layer 106 and the Ge layer 108 may be selectively chosen, for example, such that to enhance the optical coupling between the SiN layer and the Ge layer 108. As shown in FIGS. 1A-1B, the SiN layer 106 may be thus deposited atop the silicon dioxide layer 105, such that to create a separation spacing 111 between the SiN layer 106 and the Si layer 107, as an example. As an example, the separation spacing 111 and the coupling length 102 may be user selected, for example, such that to optimize the efficiency at which optical light can be coupled from the SiN launch waveguide 106 into the Ge PD 101 along a given direction of propagation and be subsequently absorbed.

As shown in FIG. 1A as an example, an optical signal 115 may be launched into the SiN waveguide 106 (disposed along an optical channel of an integrated photonics chip, for example) and may propagate laterally along the SiN waveguide 106 toward the Ge PD 101. As an example, the optical signal 115 may subsequently be evanescently coupled into the Ge PD 101 at the side 108A of the Ge layer 108, as shown in FIG. 1B, for example. The light from the optical signal 115 effectively coupled into the Ge PD 101 may then be absorbed, as mentioned previously above, by the germanium layer 108, for example. A biasing voltage may be applied to the aluminum electrodes 110, as mentioned previously above, such that to reverse bias the P-I-N junction-based diode (not shown) formed within the Ge layer 108 and cause a conversion of the absorbed optical light into an electrical signal, that may then be electrically transmitted from the tungsten vias 109 and metal electrodes 110 out to external electrical contacts (e.g., wires connected to an external device, such as a computer), and thus resulting in the optical-to-electrical conversion of the launched optical signal 115. For example, the top oxide layer 105 may be adapted to be opened (not shown), such that to enable direct electrical connection to the metal electrodes 110 with external wires. Thus, an advantage of the disclosed integrated germanium photodetector is that optical light may be effectively absorbed and converted to an electrical signal readable by an external device.

As mentioned previously above in this disclosure, the Ge PD disclosed herein may be categorized as either a lateral photodetector or a vertical photodetector, depending on the given arrangement of the vias 109 and metal electrodes 110, as well as the diode implantations (not shown), for example. As an example, as shown in FIGS. 1A-1B, the tungsten vias 109 of the Ge PD 101 are provided on different layers (e.g., 108 versus 107), and thus possess differing thicknesses/heights, as shown in FIG. 1B. Because of this chosen implantation design of the tungsten vias 109, the Ge PD 101 shown in FIGS. 1A-1B may thus be categorized as a vertical photodetector. However, as will be described in more detail when referring to FIGS. 5A-5B below, the Ge PD 101 may be alternatively designed to be thus categorized as a lateral photodetector.

As shown in FIG. 1B, as opposed to silicon waveguides whose cross section is conventionally rectangular in shape (e.g., 500 nm×220 nm) due to the thin silicon layer (e.g., 107), the silicon nitride waveguide 106 can be designed to have a square shaped cross section (e.g., 400 nm×400 nm), as an example. The square shaped cross section of the silicon nitride waveguide 106, from the point of view of an optical signal propagating along the silicon nitride waveguide, for example, may enable light at both transverse electric (TE) and transverse magnetic (TM) polarizations to have equal group index, and thus enable the light to experience the same group delay when propagating along the SiN launch waveguide 106, as an example. Such effects may be particularly useful for polarization-insensitive receivers (e.g., a receiver positioned at the output of a silicon photonics chip having the Ge PD 101) for certain polarization-division-multiplexing applications, for example, in which the mismatch of the group delays (i.e., nonidentical group delays) of TE and TM polarized light is required to be as small as possible. Additionally, silicon nitride waveguides usually show lower propagation loss than silicon waveguides, which may be beneficial for low-loss receiver design. Thus, an advantage of the disclosed integrated germanium photodetector with silicon nitride waveguide is the enabling of matched TE and TM polarized light group delays, which is beneficial for sensitive receivers. An additional advantage is that silicon nitride waveguides affect lower propagation loss on an optical signal than silicon waveguides, which is also beneficial for sensitive receivers.

Additionally, silicon nitride waveguides possess greater power handling capabilities than silicon waveguides, for example, due to low index contrast, and thus less confinement (i.e., lower energy density inside the waveguide), and weak nonlinear effects. Such characteristics may thus allow silicon nitride waveguides to receive optical signals having higher levels of launch power, as compared to silicon waveguides, which may thus allow the launching of greater optical power into the Ge PD, as an advantage. As mentioned previously in the Background above, silicon waveguides possess high absorption at visible light ranges, preventing visible light detection by a Ge PD using a silicon launch waveguide, as a disadvantage. However, silicon nitride material is transparent to visible light. As such, the broader transparent window enables silicon nitride material to be utilized in a wide variety of optical applications, such as, for example, optical communications, optical sensing, optical computing, automotive applications, quantum applications, etc., covering multiple wavelength ranges, such as, for example, visible light range, O, E, S, C, or L-band, etc. Accordingly, using silicon nitride waveguide enables the Ge PD 101 of FIGS. 1A-1B to detect visible light. Thus, an advantage of using silicon nitride launch waveguide is that the disclosed integrated germanium photodetector may be used for visible light detection.

It should be noted that to avoid potential absorption loss from the metal electrodes 110 and interconnected vias 109, the metal electrodes 110 and the vias 109 may be particularly configured to maintain a certain separation distance (e.g., 5 μm) away from the SiN waveguide 106, as shown in FIG. 1B, for example. It should be understood that, while each of the layers (e.g., 106, 108) are depicted in FIGS. 1A-1B and described above as being rectangular or square shaped (in terms of cross section, for example), the layers may be alternatively configured to have other shapes (in terms of cross section), such as, for example, circular, oval shaped, triangular, etc. It should also be understood that each of the components shown in FIGS. 1A-1B and described above that form the germanium photodetector may be constructed of alternative suitable materials, such as, for example, copper instead of aluminum for the electrodes 110. It should also be understood that, as shown in FIG. 1B, the integrated germanium photodetector 101 is provided with the top oxide layer 105, constructed from silicon dioxide, for example, disposed above the buried oxide layer 105, for providing cladding for the SiN waveguide 106 and Ge PD 101, as an example.

Figure 2A:
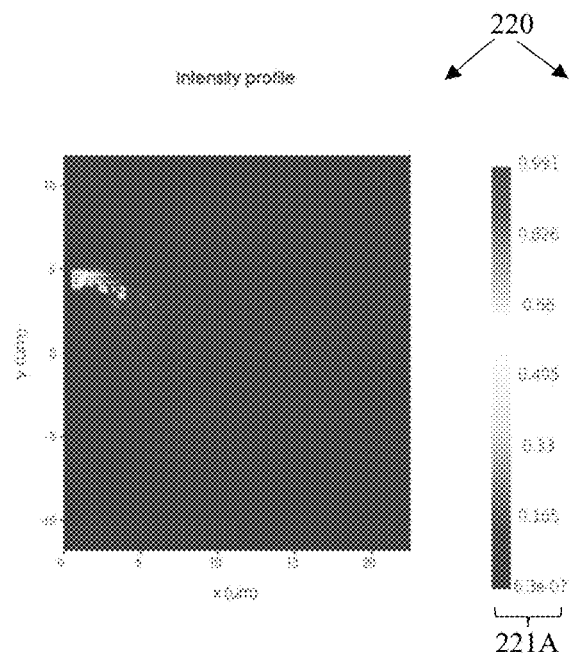
FIGS. 2A-2B are plots illustrating a top view and a side view, respectively, of a simulated optical intensity profile inside an integrated germanium photodetector having a silicon nitride launch waveguide, according to an aspect.
Figure 2B:
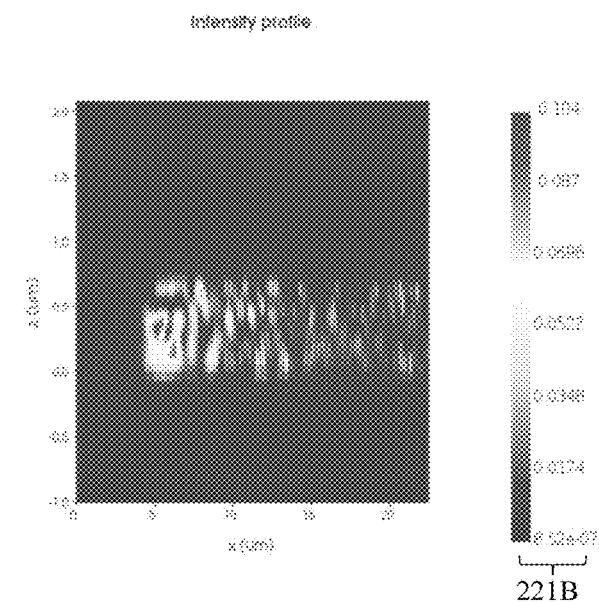

FIGS. 2A-2B are plots 220 illustrating a top view and a side view, respectively, of a simulated optical intensity profile inside an integrated germanium photodetector having a silicon nitride launch waveguide, according to an aspect. As described previously above when referring to FIGS. 1A-1B, the integrated germanium photodetector (e.g., 101) may be provided with a silicon nitride launch waveguide for evanescently coupling optical light into the integrated germanium photodetector, such that to absorb, and thus electrically read an intensity of, the optical light. As an example, let the integrated germanium photodetector be 20 μm in length and be provided with the SiN side-launch waveguide, as shown previously in FIGS. 1A-1B, for example. Simulations of the integrated germanium photodetector are shown in FIGS. 2A-2B, as will be described in detail below.

As shown, FIGS. 2A-2B illustrate the top view and the side view of the simulated optical intensity profile inside the Ge PD for light propagating at 1520 nm, respectively, as an example. As mentioned above, the integrated Ge PD may be 20 μm in length, such that the propagation distance (i.e., how far the optical light travels within the Ge PD) may also be 20 μm, as indicated on the x-axis of the plots 220, for example. As shown in FIGS. 2A-2B, the optical signal, coupled into the Ge PD via the SiN launch waveguide, may propagating through the Ge PD, and may be absorbed by the germanium layer (e.g., 108 in FIGS. 1A-1B), as indicated by the intensity levels shown at 221A and 221B, respectively. As such, it can clearly be seen that the Ge PD having the SiN side-launch waveguide may, based on the simulations shown, effectively absorb light, such that to electrically measure an intensity of the propagating light, and thus, as will be described in detail below, the optical power of the propagating light.

Figure 3:
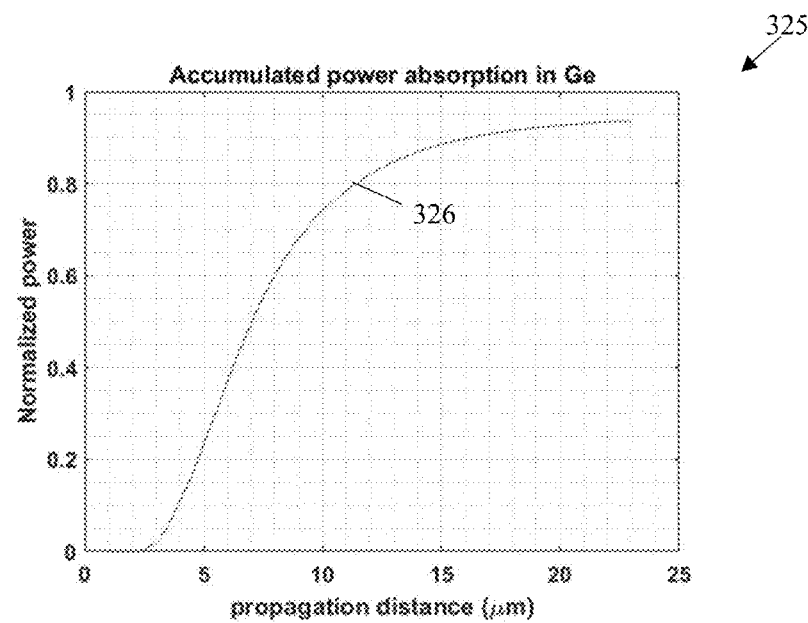
FIG. 3 is a plot illustrating the accumulated optical power absorption along the propagation distance of the Ge PD simulated in FIGS. 2A-2B, according to an aspect.

FIG. 3 is a plot 325 illustrating the accumulated optical power absorption 326 along the propagation distance of the Ge PD simulated in FIGS. 2A-2B, according to an aspect. As mentioned previously above when referring to FIGS. 2A-2B, the Ge PD simulated above was 20 μm in length, such that the propagation distance of the absorbed optical signal was also 20 μm. As shown in the plot 325 of FIG. 3, the accumulated optical power absorption 326 may be measured in terms of normalized power over the propagation distance (e.g., 20 μm), as will be described in more detail below.

As shown in FIG. 3, the normalized power, measured on a scale from 0 to 1 (on the y-axis, for example), of the accumulated optical power absorption curve 326, describes the total absorbed optical power as a function of the light propagation distance shown previously in FIGS. 2A-2B. As such, as shown by the rapid increase in normalized power of the curve 326, especially between about 4 and 10 μm, the optical power of the optical signal (described previously above) can be effectively and efficiently launched into the Ge PD via the SiN launch waveguide for efficient light absorption within the Ge layer. Thus, as outlined above and as shown in FIGS. 2A-3, the Ge PD disclosed herein having the silicon nitride launch waveguide may function to efficiently and effectively absorb optical light for the subsequent electrical measuring of optical power, for example. Thus, an advantage is that optical power can be well launched into the disclosed integrated germanium photodetector for efficient light absorption via the silicon nitride side-launch waveguide.

Figure 4A:
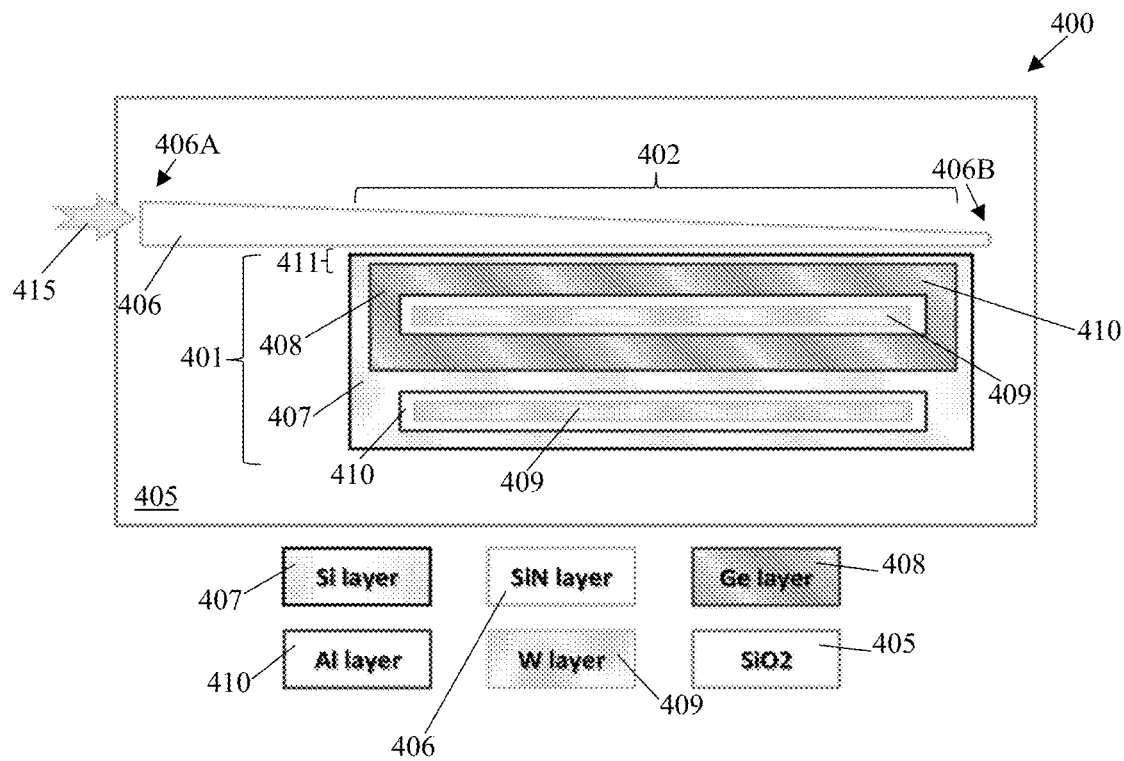
FIGS. 4A-4B are diagrams illustrating a top view and a front elevation cross-sectional view, respectively, of an optical apparatus comprising an integrated germanium photodetector and a tapered silicon nitride launch waveguide, according to an aspect.
Figure 4B:
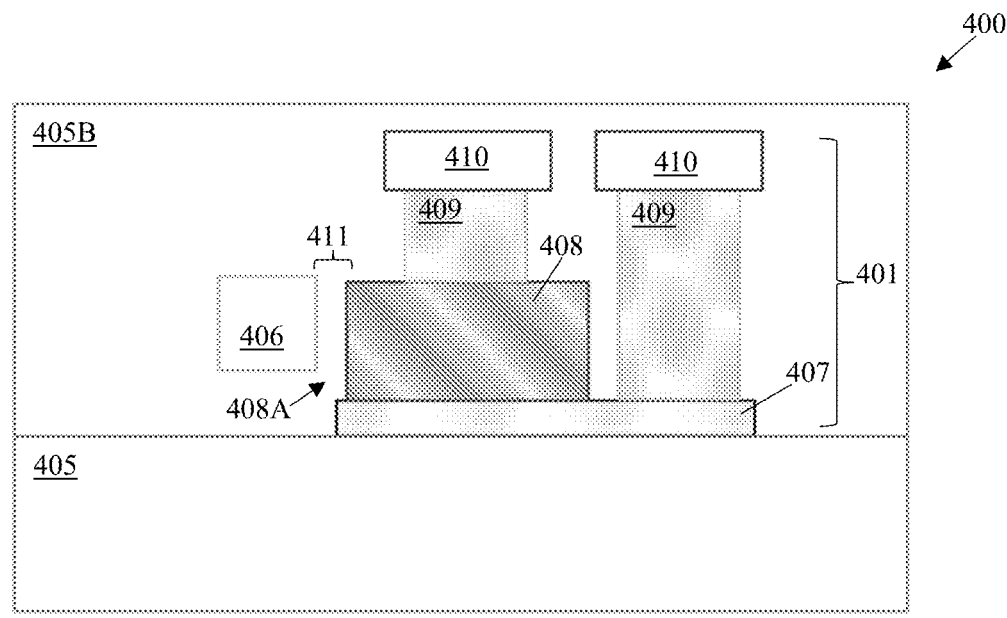

FIGS. 4A-4B are diagrams illustrating a top view and a front elevation cross-sectional view, respectively, of an optical apparatus 400 comprising an integrated germanium photodetector 401 and a tapered silicon nitride launch waveguide 406, according to an aspect. As described previously throughout this disclosure above, the SiN side-launch waveguide (e.g., 106 in FIGS. 1A-1B) may enable optical light to be evanescently coupled into the integrated germanium photodetector (e.g., 101 in FIGS. 1A-1B) for efficient light absorption. As shown previously in FIGS. 1A-1B, the silicon nitride waveguide discussed herein previously was described as having a square (or rectangular) shaped cross-section (e.g., as in FIG. 1B), such that the SiN waveguide possesses a square (or rectangular) prism shape, and thus a uniform width along an entire length of the waveguide, for example. As will be described in detail below, the SiN waveguide 406 of FIG. 4 may be alternatively configured such that to possess a tapered shape having a certain length, as an example.

As an example, let the integrated germanium photodetector 401 comprise the same exemplary elements as that shown previously in FIGS. 1A-1B. As such, the integrated Ge PD 401 may comprise a buried oxide layer 405 and a top oxide layer 405B, each constructed of silicon dioxide ($SiO_2$), as indicated, for example, provided at a bottom or base of the integrated Ge PD 401 and surrounding the Ge PD 101, respectively. As shown, atop the silicon dioxide layer 405, a silicon (Si) layer 407 may be provided, which may have a user-selected thickness, as shown in FIG. 4B. Furthermore, a germanium layer 408 may be provided atop the Si layer 407, as shown, and may also comprise a user-selected thickness, as shown in FIG. 4B. As shown in FIGS. 4A-4B, a pair of tungsten (W) vias 409 may be parallelly distributed within the germanium photodetector 101. As shown as an example, a first W via of the pair of W vias 409 may be deposited atop the Ge layer 408, and a second W via of the pair of W vias 409 may be deposited adjacently beside the Ge layer 408, where the second W via has a greater thickness/height than the first W via, as shown in FIG. 4B. Finally, as shown, an aluminum (Al) electrode 410 may be interconnected atop each tungsten via 409, such that to provide the Ge PD 401 with a metal contact, for example, for receiving a biasing voltage. Thus, as similarly mentioned previously above, the Ge PD 401 may be used for providing the optical-to-electrical conversion capability for a propagating optical signal.

As mentioned previously above, the Ge PD 401 may be provided with the tapered silicon nitride side-launch waveguide 406 for evanescently coupling optical light into the Ge PD 401, as an example. As shown in FIGS. 4A-4B, the silicon nitride launch waveguide 406, surrounded by the top oxide layer cladding 405B, may be provided parallelly to a side 408A of the Ge layer 408, as an example. As shown in FIG. 4A, the SiN launch waveguide/layer 406 may extend a length greater than that of the Si layer 407 along the silicon dioxide layer 405, as an example, such that to create a side-overlapping coupling region/portion 402, having a length, between the SiN layer 406 and the Ge layer 408. Additionally, as shown in FIG. 4A, the SiN waveguide 406 may comprise a first end 406A having a first width, for example, and an opposite second end 406B having a second width. As shown, the first width may be larger than the second width, such that the shape of the SiN waveguide 406 gradually tapers from the first end 406A to the second end 406B, as an example. As shown in FIGS. 4A-4B, the SiN layer 406 may be thus deposited atop the silicon dioxide layer 405, such that to create a separation spacing 411 between the side SiN layer 406 and the Si layer 407, as an example. As an example, the separation spacing 411 and the coupling length 402 may be user selective, for example, such that to optimize the efficiency at which optical light can be coupled from the SiN launch waveguide 406 into the Ge PD 401 along a given direction of propagation and be subsequently absorbed. Furthermore, as an example, the separation spacing 411 does not have to be fixed along the propagation direction, and may instead be varied, as needed/desired.

As shown in FIG. 4A as an example, an optical signal 415 may be launched into the SiN waveguide 406 (disposed along an optical channel of an integrated photonics chip, for example) at the first end 406A. As the optical signal 415 propagates laterally along the SiN waveguide 406 toward the Ge PD 401, for example, the optical signal 415 may be gradually coupled from the SiN waveguide 406 into the Ge PD 401 at the side 408A of the Ge layer 408, as shown in FIG. 4B, as an example. The gradual coupling of the optical signal 415, due to the tapered shape (i.e., triangular shape, as shown in FIG. 4A) of the SiN waveguide 406, for example, may achieve an adiabatic mode evolution. Shown previously, the strong coupling of the optical signal into the Ge PD (e.g., 101) at the beginning of the coupling region (e.g., 102), due to the uniform width of the SiN waveguide shown previously in FIG. 1A, for example, could cause saturation of the optical power of the optical signal (e.g., 115), which may be undesirable. Thus, the use of the tapered SiN launch waveguide 406 may reduce instances of PD saturation and therefore enhance the Ge PD's high power-handling capability.

Continuing the example above, the light from the optical signal 415 gradually coupled into the Ge PD 401 may then be absorbed, as mentioned previously above, by the germanium layer 408, for example. A biasing voltage may be applied to the aluminum electrodes 410, such that to reverse bias the P-I-N junction-based diode within the Ge layer 408 and thus cause a conversion of the absorbed optical light into an electrical signal, that may then be electrically transmitted from the tungsten vias 409 and the metal electrodes 410 out to external electrical contacts (e.g., wires connected to an external device, such as a computer). In this way, the optical light absorbed by the Ge layer 408 may be converted into an electrical signal, as mentioned above, for power monitoring, high speed optical-to-electrical conversion, etc., of the launched optical signal 415. For example, the top oxide layer 405B may be adapted to be opened (not shown), for example, such that to enable direct electrical connection between the metal electrodes 410 and external wires. Thus, an advantage of using a tapered silicon nitride launch waveguide is that the high power-handling capability of the integrated germanium photodetector may be enhanced.

It should be understood that the previously described advantages and benefits for the Ge PD shown previously in FIGS. 1A-1B are maintained for the Ge PD 401 shown in FIGS. 4A-4B. Accordingly, for example, because of the utilization of the SiN launch waveguide 406, the advantages of low propagation loss, visible light detection, and efficient light absorption also apply to the integrated Ge PD 401 of FIGS. 4A-4B. It should also be understood that, as mentioned previously in this disclosure above, the layers of the integrated germanium photodetector 401 may be constructed of alternative suitable materials, as desired. It should also be understood that, as shown in FIG. 4B, the integrated germanium photodetector 401 is provided with a top oxide layer 405B, constructed from silicon dioxide, for example, disposed above the buried oxide layer 405, for example, as previously mentioned above, such that to provide cladding for the silicon nitride launch waveguide 406 and the Ge PD 401.

Figure 5A:
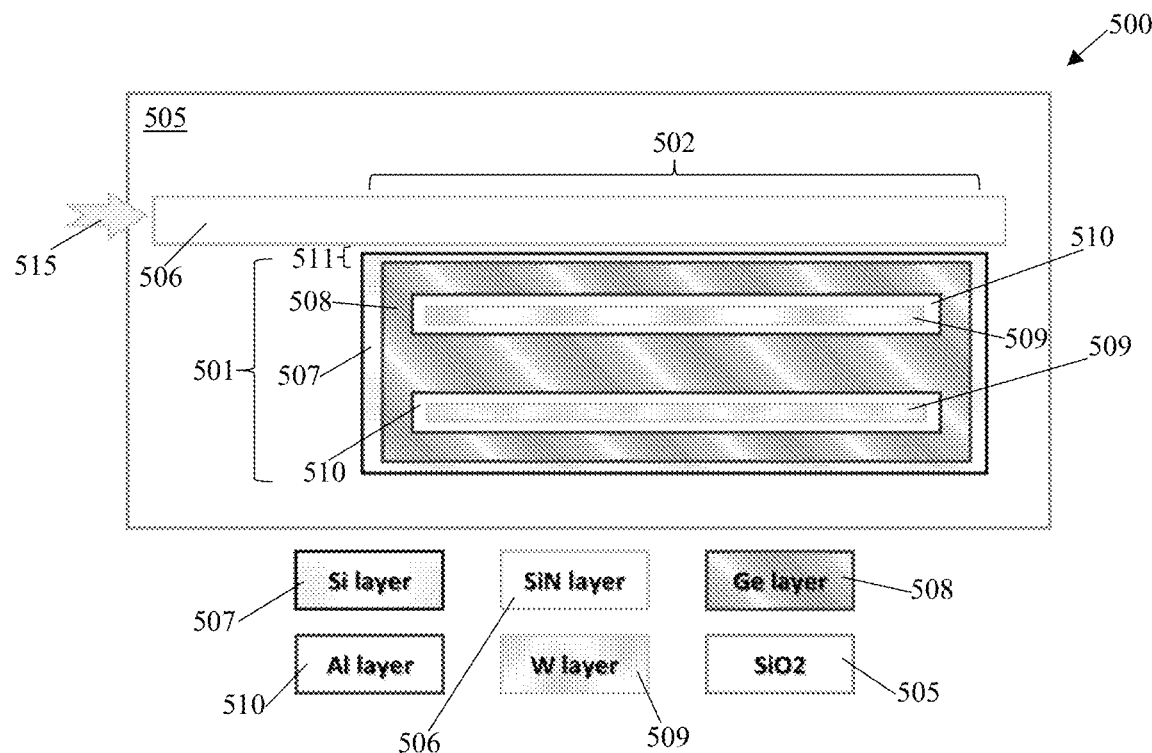
FIGS. 5A-5B are diagrams illustrating a top view and a front elevation cross-sectional view, respectively, of an optical apparatus comprising a lateral integrated germanium photodetector and a silicon nitride launch waveguide, according to an aspect.
Figure 5B:
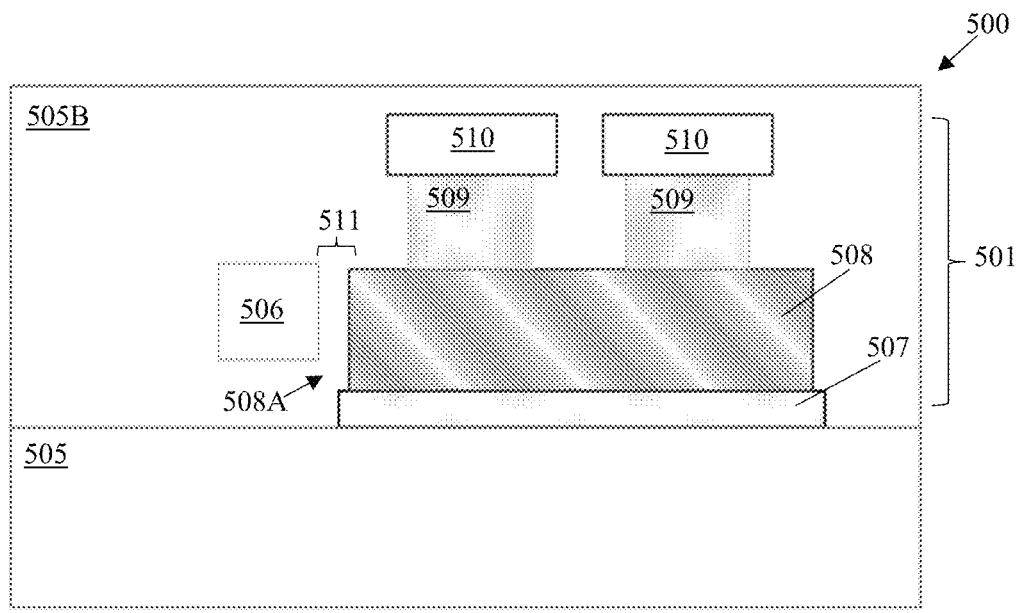

FIGS. 5A-5B are diagrams illustrating a top view and a front elevation cross-sectional view, respectively, of an optical apparatus 500 comprising a lateral integrated germanium photodetector 501 and a silicon nitride launch waveguide 506, according to an aspect. As mentioned previously above when referring to FIGS. 1A-1B, the integrated Ge PD disclosed herein may be categorized as either a lateral photodetector or a vertical photodetector, depending on the given arrangement of the diode implantations (not shown), the vias (e.g., 109), and metal electrodes (e.g., 110), for example. For example, as described previously above, the Ge PD 101 shown in FIGS. 1A-1B may be categorized as a vertical photodetector. Similarly, again because the tungsten vias (e.g., 409) of the Ge PD 401 shown in FIGS. 4A-4B are provided on different layers (e.g., 408 versus 407), and thus possess differing thicknesses/heights, as shown previously in FIG. 4B, the Ge PD 401 shown previously in FIGS. 4A-4B may thus also be categorized as a vertical photodetector. However, as will be described in more detail below, the Ge PD described throughout this disclosure above may be alternatively designed to be categorized as a lateral photodetector.

As an example, let the integrated germanium photodetector 501 shown in FIGS. 5A-5B comprise the same exemplary elements as that shown previously in FIGS. 1A-1B. As such, the integrated Ge PD 501 may comprise a buried oxide layer 505 and a top oxide layer 505B, each constructed of silicon dioxide, as indicated, for example, provided at a bottom or base of the integrated Ge PD 501 and surrounding the Ge PD 501, respectively. As shown, atop the bottom silicon dioxide layer 505, a silicon layer 507 may be provided, which may have a user-selected thickness, as shown in FIG. 5B. Furthermore, a germanium layer 508 may be provided atop the Si layer 507, as shown, and may also comprise a user-selected thickness, as shown in FIG. 5B. As shown in FIGS. 5A-5B, a pair of tungsten vias 509 may be parallelly deposited centrally atop the germanium layer 508, such that the pair of vias 509 possess equal thicknesses/heights, as shown in FIG. 5B. Finally, as shown, an aluminum electrode 510 may be interconnected atop each tungsten via 509, such that to provide the Ge PD 501 with a metal contact for receiving a biasing voltage, as an example. Thus, as similarly mentioned previously above, the Ge PD 101 may provide the optical-to-electrical conversion capability for a propagating optical signal.

As shown in FIGS. 5A-5B, the silicon nitride launch waveguide 506 may be provided to a side of the integrated Ge PD 501, such that a separation spacing 511 is created between the SiN waveguide 506 and the side 508A of the Ge layer 508, as an example. As shown in FIG. 5A, the SiN launch waveguide/layer 506 may extend a length greater than that of the Si layer 507 along the silicon dioxide layer 505, as an example, such that to create a side-overlapping coupling portion/region 502, having a length, between the SiN layer 506 and the Ge layer 508. Thus, optical light 515 being launched into the SiN launch waveguide 506 may be evanescently coupled into the Ge PD 501 from the side, as an example.

As mentioned above, the Ge PD 501 may be configured such that to be classified as a lateral PD, as an example. As described previously when referring to FIGS. 1A-1B, the configuration of the diode implantations (not shown), the tungsten vias 509, and the interconnected electrodes 510 determines this classification. Thus, because a lateral P-I-N diode is formed by implantations (not shown) and then the tungsten vias 509 are both deposited atop the germanium layer 508 to contact the P and N side of the diode, as shown, the Ge PD 501 may thus be classified as a lateral PD. Accordingly, as outlined above, the silicon nitride side-launch waveguide may accommodate either vertical PDs or lateral PDs, as desired, for evanescently coupling optical light into the PD, as an example. Thus, an advantage is that the disclosed silicon nitride waveguide may enable optical light to be evanescently coupled into, and thus absorbed by, either vertical or lateral integrated germanium photodetector varieties.

It should be understood that the lateral Ge PD 501 shown in FIGS. 5A-5B may alternatively be provided with a tapered SiN side-launch waveguide (e.g., 406), such as that shown previously in FIGS. 4A-4B above. It should also be understood that the previously described advantages and benefits for the Ge PD shown previously in FIGS. 1A-1B are maintained for the lateral Ge PD 501 shown in FIGS. 5A-5B. Accordingly, for example, because of the utilization of the SiN launch waveguide 406, the advantages of low propagation loss, visible light detection, and efficient light absorption also apply to the integrated Ge PD 501 of FIGS. 5A-5B. It should also be understood that, as mentioned previously in this disclosure above, the layers of the integrated germanium photodetector 501 may be constructed of alternative suitable materials, as desired.

Figure 6A:
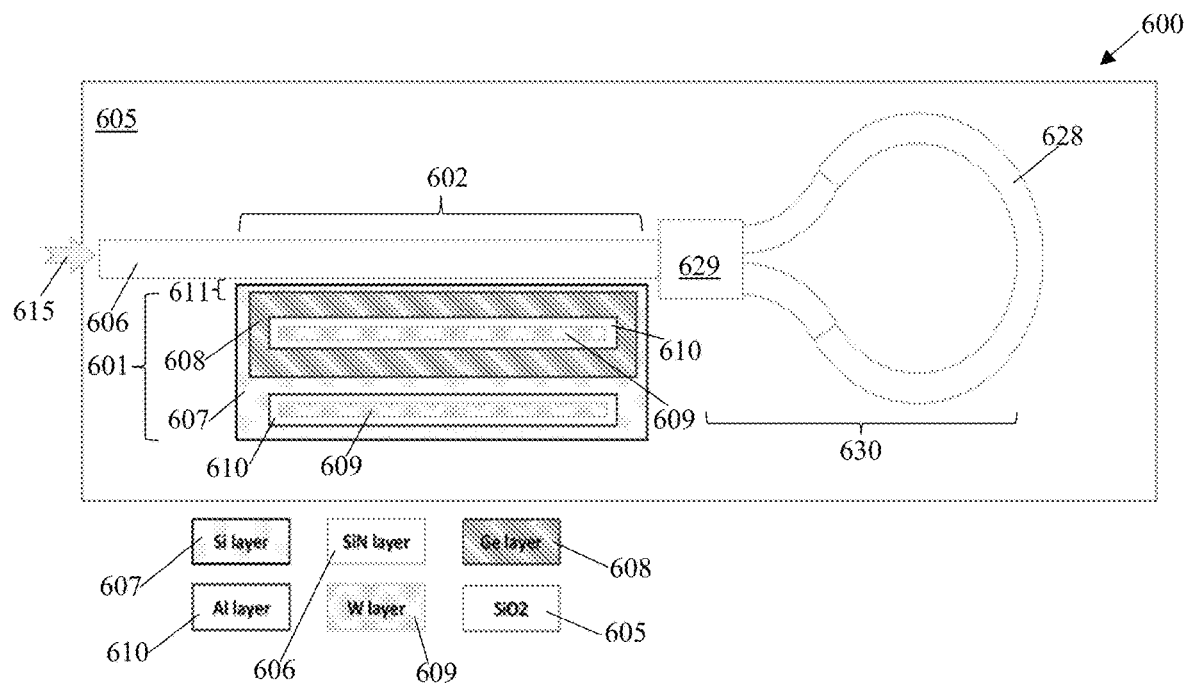
FIGS. 6A-6B are diagrams illustrating top views of optical apparatuses, respectively, each comprising an integrated germanium photodetectors and a silicon nitride launch waveguide having a Sagnac ring reflector, according to an aspect.
Figure 6B:
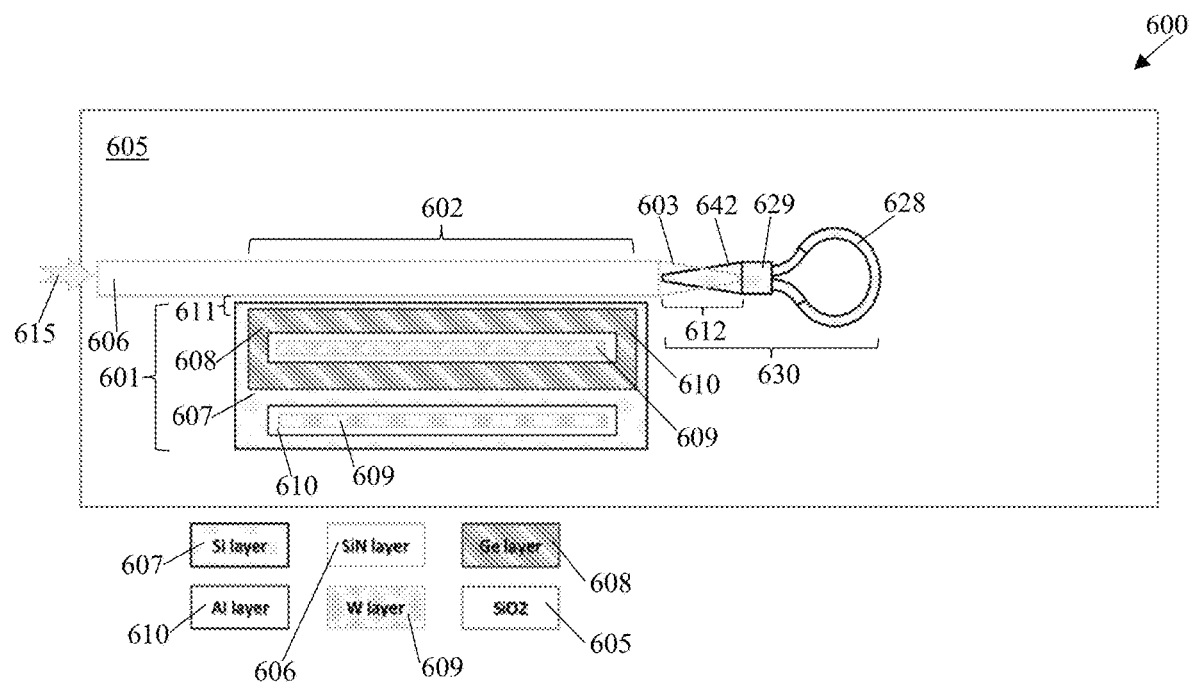

FIGS. 6A-6B are diagrams illustrating top views of optical apparatuses 600, respectively, each comprising an integrated germanium photodetectors 605 and a silicon nitride launch waveguide 606 having a Sagnac ring reflector 630, according to an aspect. As described throughout this disclosure above, the integrated germanium photodetector, configured as either a vertical PD or a lateral PD, may be provided with a silicon nitride waveguide, configured as being either square prism shaped or tapered, for evanescently coupling light into the germanium photodetector from either the side or the top, for example, for light absorption. As an example, let the integrated germanium photodetectors 601 shown in FIGS. 6A-6B, respectively, comprise the same exemplary elements as that shown previously in FIGS. 1A-1B. As such, each integrated germanium photodetector 601 may comprise a buried silicone dioxide layer 605 and a top oxide layer (not shown), a silicon layer 607 deposited atop the bottom silicon dioxide layer 605, a germanium layer 608 deposited atop the silicon layer 607, a pair of tungsten vias 609 each disposed atop the germanium layer 608 and the silicon layer 607, respectively, and finally, a pair of aluminum electrodes 610 interconnected to the tungsten vias 609, as an example. As will be described in detail below, the silicon nitride waveguide may further be provided with a reflector disposed at a rear end of the silicon nitride waveguide, as an example.

As shown in FIG. 6A, the silicon nitride launch waveguide 606 may be provided to a side of the integrated Ge PD 601, such that a separation spacing 611 is created between the SiN waveguide 606 and the Ge layer 608, as an example. As shown in FIG. 6A, the SiN launch waveguide/layer 606 may extend a length greater than that of the Si layer 607 along the silicon dioxide layer 605, as an example, such that to create a side-overlapping coupling portion/region 602, having a length, between the SiN layer 606 and the Ge layer 608. As mentioned above, the silicon nitride launch waveguide 606 may be provided with an end reflector 630, which, in the example shown in FIG. 6A, may be formed by a 1×2 multimode interferometer (MMI) 629 and a Sagnac ring 628 deposited directly onto the silicon-nitride layer 606, as shown an example. Since the Sagnac ring 628 can provide a wideband reflection, optical light (e.g., 615) that is not fully absorbed when propagating laterally along the SiN launch waveguide 606 can be reflected backwardly to undergo light absorption a second time, as will be discussed in more detail below. It should be understood that although an MMI (629) is depicted as being used to form the reflector 630, a Y junction, directional coupler, adiabatic coupler, etc. may alternatively be used, for example.

For example, the optical signal 615 may be launched into the SiN launch waveguide 606 (disposed along an optical channel of an integrated photonics chip, for example) and may propagate laterally along the SiN waveguide 606 toward the Ge PD 601. As an example, the optical signal 615 may subsequently be evanescently coupled into the Ge PD 601 from the side, as discussed previously, such that the optical light of the optical signal 615 may be absorbed by the Ge layer 608 a first time. Any light from the optical signal 615 that has not been effectively coupled into the Ge PD 601 may continue propagating laterally beyond the coupling region 602, for example, such that to optically pass through the 1×2 MMI 629. The remaining optical light may traverse a loop around the Sagnac ring 628, for example, such that the portion of the optical signal 615 that was not absorbed initially may propagate back toward the Ge PD 601, such that to then be fully absorbed by the Ge layer 608 via the second attempt, as mentioned previously above. In this way, optical light from a propagating optical signal can be effectively fully absorbed and thus a stronger optical-to-electrical conversion of the launched optical signal 615 may be achieved.

As shown in FIG. 6B, another embodiment of the silicon nitride launch waveguide 606 may be provided to a side of the integrated Ge PD 601, such that a separation spacing 611 is created between the SiN waveguide 606 and the Ge layer 608, as an example. Again, as shown in FIG. 6B, the SiN launch waveguide/layer 606 may extend a length greater than that of the Si layer 607 along the silicon dioxide layer 605, as an example, such that to create a side-overlapping coupling portion/region 602, having a length, between the SiN layer 606 and the Ge layer 608. As mentioned above, the silicon nitride launch waveguide 606 may be provided with an end reflector 630, which, in the example shown in FIG. 6B, may be formed by a SiN to Si transition 612, which may comprise a tapered SiN layer 603 being deposited above an inversely tapered Si layer 642, a 1×2 MMI 629 and a Sagnac ring 628 deposited directly onto the silicon layer 642, as shown an example. Since the Sagnac ring 628 can provide a wideband reflection, optical light (e.g., 615) that is not fully absorbed when propagating laterally along the SiN launch waveguide 606 can be reflected backwardly to experience light absorption a second time, as will be discussed below.

For example, the optical signal 615 may be launched into the SiN launch waveguide 606 (disposed along an optical channel of an integrated photonics chip, for example) and may propagate laterally along the SiN waveguide 606 toward the Ge PD 601. As an example, the optical signal 615 may subsequently be evanescently coupled into the Ge PD 601 from the side, as discussed previously, such that the optical light of the optical signal 615 may be absorbed by the Ge layer 608 a first time. Any light from the optical signal 615 that has not been effectively coupled into the Ge PD 601 may continue propagating laterally beyond the coupling region 602, for example, such that to optically pass through the SiN to Si transition 612 and the optically connected silicon 1×2 MMI 629. The remaining optical light may traverse a loop around the silicon Sagnac ring 628, for example, such that the portion of the optical signal 615 that was not absorbed initially may propagate back toward the Ge PD 601, such that to then be fully absorbed by the Ge layer 608 via the second attempt, as described similarly above. In this way, optical light from a propagating optical signal can be effectively fully absorbed and thus a stronger optical-to-electrical conversion of the launched optical signal 615 may be achieved. Compared to the SiN Sagnac ring 628 of FIG. 6A, the silicon Sagnac ring 628 of FIG. 6B can be configured to be more compact (as shown) due to the high index contrast of the silicon integrated waveguide disclosed herein, saving space on the integrated photonics chip (not shown) and also reducing the delay time of the reflected optical signal, as an advantage.

As an example, a length of the Ge PD 601 (e.g., 602) described above can be configured such that to ensure full light absorption (i.e., optimize light absorption) and to thus achieve low reflection levels at the launch waveguide input. Accordingly, the reflector 630 of FIGS. 6A-6B may enable the length of the Ge PD 601 to be effectively reduced (e.g., by half), since the light being reflected by the Sagnac ring 628, in either embodiment, may traverse back toward the Ge PD 601, as described above, effectively traveling the length of the Ge PD 601 twice for light absorption, for example. The reduced length of the Ge PD 601 may therefore reduce the area of the PD, resulting in a smaller capacitance and thus a larger radio frequency (RF) bandwidth tolerance, which may improve the device's RC-limited RF bandwidth for high-speed applications. The reduced area of the PD may also help decrease the PD's dark current, as an example. Thus, an advantage of using a reflector with the silicon nitride launch waveguide is that the length of the integrated germanium photodetector may be reduced, which may thus reduce costs associated with manufacturing the integrated germanium photodetector. An additional advantage is that, because the integrated germanium photodetector length may be reduced, the device's RF bandwidth may be increased, which may benefit high-speed optical applications. An additional advantage is that, because the integrated germanium photodetector length may be reduced, the dark current of the PD can be reduced. It should be understood that although MMI is used in FIG. 6A and FIG. 6B as an example, the 1×2 splitter does not have to be an MMI. It can also be a Y junction, a directional coupler, an adiabatic coupler, a bent coupler, and so on.

Figure 7:
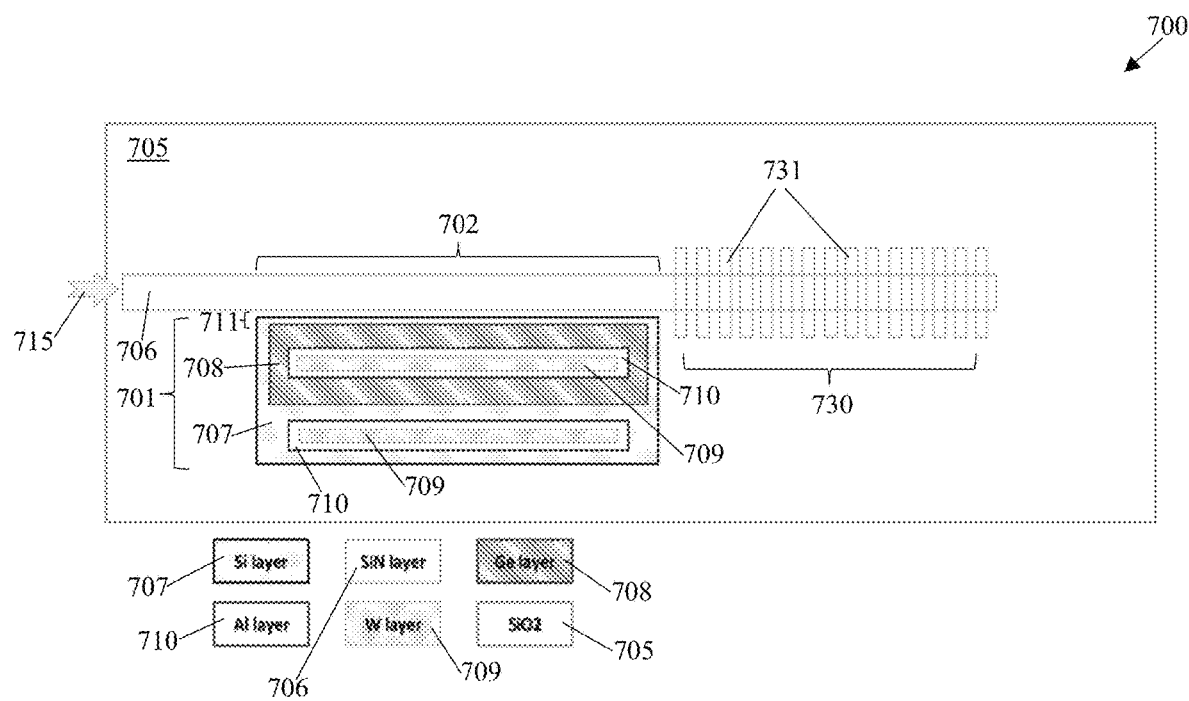
FIG. 7 is a diagram illustrating a top view of an optical apparatus comprising an integrated germanium photodetector and a silicon nitride launch waveguide having a Bragg gratings reflector, according to an aspect.

FIG. 7 is a diagram illustrating a top view of an optical apparatus 700 comprising an integrated germanium photodetector 701 and a silicon nitride launch waveguide 706 having a Bragg gratings reflector 730, according to an aspect. As described previously above when referring to FIGS. 6A-6B, the silicon nitride waveguide may further be provided with a reflector (e.g., 630) disposed at a rear end of the silicon nitride waveguide, for example, to allow reflected optical light to be absorbed by the integrated Ge PD. As will be described in detail below, the reflector may alternatively be constructed using a Bragg grating disposed along the rear end of the silicon nitride waveguide, as an example.

As an example, let the integrated germanium photodetector 701 shown in FIG. 7 comprise the same exemplary elements as that shown previously in FIGS. 1A-1B. As such, the integrated germanium photodetector 701 may comprise a buried silicone dioxide layer 705 and a top oxide layer (not shown), a silicon layer 707 deposited atop the bottom silicon dioxide layer 705, a germanium layer 708 deposited atop the silicon layer 707, a pair of tungsten vias 709 disposed atop the germanium layer 708 and the silicon layer 707, respectively, and finally, a pair of aluminum electrodes 710 interconnected with the tungsten vias 709, as an example. As described previously throughout this disclosure above, the aforementioned layers that form the integrated germanium photodetector 701 may be constructed of alternative suitable materials, as desired.

As shown in FIG. 7, the silicon nitride launch waveguide 706 may be provided parallelly to a side of the integrated Ge PD 701, such that a separation spacing 711 is created between the SiN waveguide 706 and the Ge layer 708, as an example. As shown in FIG. 7, the SiN launch waveguide 706 may extend a length greater than that of the Si layer 707 along the silicon dioxide layer 705, as an example, such that to create a side-overlapping coupling portion/region 702, having a length, between the SiN layer 706 and the Ge layer 708. As mentioned above, the silicon nitride launch waveguide 706 may be provided with an end reflector 730, which, in the example shown in FIG. 7, may alternatively be formed by a Bragg grating 731, formed by periodic sidewall corrugations, for example, on the SiN layer 706, as shown as an example. Similar to the Sagnac reflector (e.g., 628 in FIGS. 6A-6B) described above, the Brag grating 731 may be configured to reflect particular wavelengths of light, such that optical light (e.g., 715) propagating at a particular wavelength (e.g., 1580 nm) that is not fully absorbed when propagating laterally along the SiN launch waveguide 706 can be reflected backwardly to experience light absorption a second time. Although the Bragg grating 731 is shown in FIG. 7 as being formed by a plurality of sidewall corrugations, the Brag grating 731 may alternatively be formed using photonic crystals, waveguide crossings, layer transitions, etc., for example.

For example, the optical signal 715 having a particular wavelength (e.g., 1580 nm) may be launched into the SiN launch waveguide 706 (disposed along an optical channel of an integrated photonics chip, for example) and may propagate laterally along the SiN waveguide 706 toward the Ge PD 701. As an example, the optical signal 715 may subsequently be evanescently coupled into the Ge PD 701 from the side, as discussed previously, such that the optical light of the optical signal 715 may be partially absorbed by the Ge layer 708 a first time. Any light from the optical signal 715 that has not been effectively coupled into the Ge PD 701 may continue propagating laterally beyond the coupling region 702, for example, such that to optically reach the Bragg grating 731 of the reflector 730. As the remaining optical light traverses through the Bragg grating 731, a portion of the optical signal 715 (e.g., at 1580 nm) is caused to reflect, due to the wavelength reflection of each Bragg grating 731, for example. The optical light may be reflected, such that the portion of the optical signal 715 that was not absorbed initially may propagate back toward the Ge PD 701, such that to then be fully absorbed by the Ge layer 708 via the second attempt, as mentioned previously above. In this way, optical light from a propagating optical signal having a particular wavelength can be effectively fully absorbed and thus a stronger optical-to-electrical conversion of the launched optical signal 715 may be achieved. It should be understood that the Bragg gratings 731 may be specifically adapted to accumulatively reflect one or more wavelengths (i.e., large bandwidth) of optical light intended to be used with the integrated Ge PD disclosed above.

As an example, a length of the Ge PD 701 (e.g., 702) can be configured such that to ensure full light absorption (i.e., optimize light absorption) and to thus achieve low reflection levels at the launch waveguide input. Accordingly, the reflector 730 of FIG. 7 may enable the length of the Ge PD 701 to be effectively reduced (e.g., by half), since the light being reflected by the plurality of Bragg gratings 731 may traverse back toward the Ge PD 701, as described above, effectively traveling the length of the Ge PD 701 twice for light absorption, for example. The reduced length of the Ge PD 701 may therefore reduce the area of the PD, resulting in a smaller capacitance and thus a larger radio frequency (RF) bandwidth tolerance, which may improve the device's RC-limited RF bandwidth for high-speed applications. The reduced area of the PD may also help decrease the PD's dark current, as an example. Thus, an advantage of using a Bragg grating reflector with the silicon nitride launch waveguide is that the length of the integrated germanium photodetector may be reduced, which may thus reduce costs associated with manufacturing the integrated germanium photodetector. An additional advantage is that, because the integrated germanium photodetector length may be reduced, the device's RF bandwidth may be increased, which may benefit high-speed optical applications. Another advantage is that, because the integrated germanium photodetector length may be reduced, the dark current of the PD can be reduced as well.

Figure 8A:
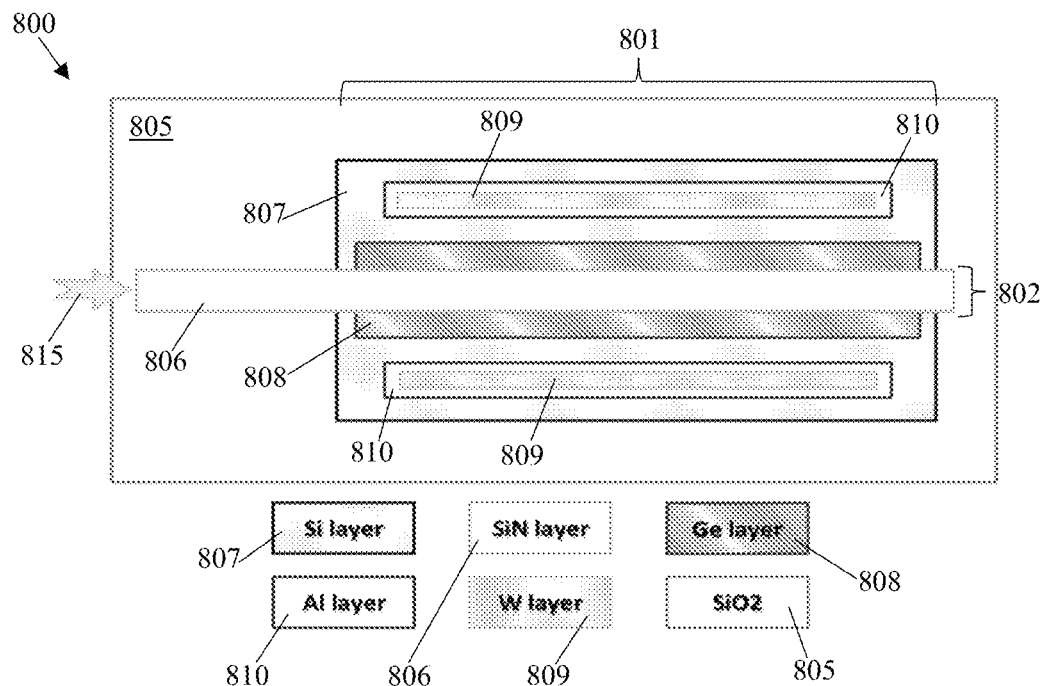
FIGS. 8A-8B are diagrams illustrating a top view and a front elevation cross-sectional view, respectively, of an alternative embodiment of the optical apparatus comprising a lateral integrated germanium photodetector and a silicon nitride launch waveguide above, according to an aspect.
Figure 8B:
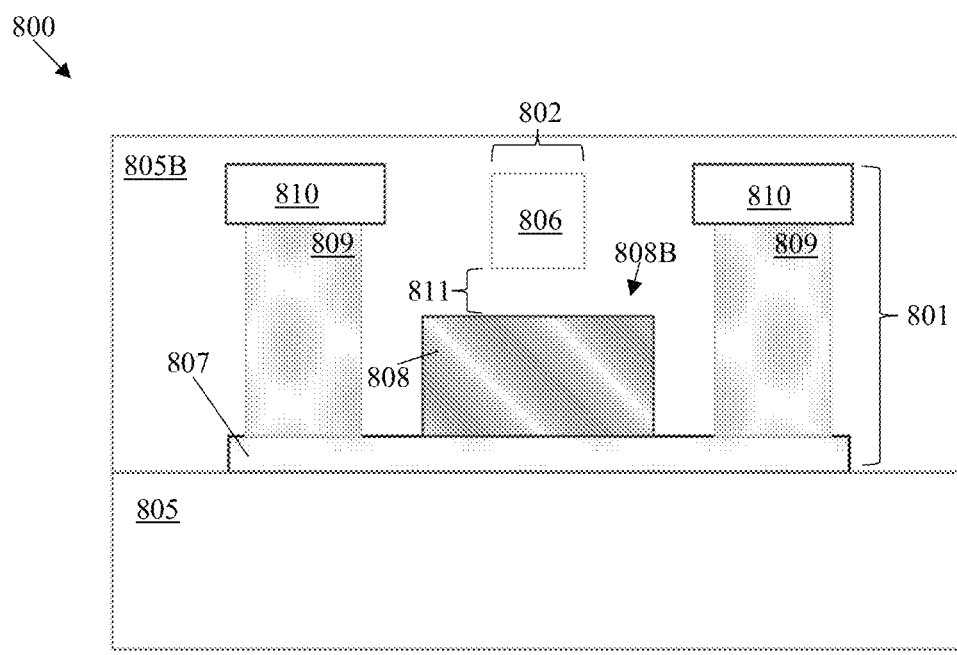

FIGS. 8A-8B are diagrams illustrating a top view and a front elevation cross-sectional view, respectively, of an alternative embodiment of the optical apparatus 800 comprising a lateral integrated germanium photodetector 801 and a silicon nitride launch waveguide 806, according to an aspect. As described throughout this disclosure above, the integrated germanium photodetector of the present invention may be provided as either a lateral PD or a vertical PD, based on the chosen configurations of the diode implantations (not shown), the vias (e.g., 709), and the interconnected metal contacts (e.g., 710). Additionally, as disclosed herein above, the silicon nitride waveguide (e.g., 706) may be provided parallelly to a side of the germanium layer of the integrated germanium photodetector. As will be described in detail below, in an alternative embodiment 800 of the disclosed optical apparatus, a lateral Ge PD may be provided with a silicon nitride waveguide disposed above the germanium layer, rather than to a side of it, for example.

As an example, let the integrated germanium photodetector 801 shown in FIGS. 8A-8B comprise the same exemplary elements as that shown previously in FIGS. 1A-1B. As such, the integrated Ge PD 801 may comprise a buried oxide layer 805 and a top oxide layer 805B, each constructed of silicon dioxide, as indicated, for example, provided at a bottom or base of the integrated Ge PD 801 and surrounding the Ge PD 801, respectively. As shown, atop the bottom silicon dioxide layer 805, a silicon layer 807 may be provided, which may have a user-selected thickness, as shown in FIG. 8B. Furthermore, a germanium layer 808 may be provided centrally atop the Si layer 807, as shown, and may also comprise a user-selected thickness, as shown in FIG. 8B. As shown in FIGS. 8A-8B, a pair of tungsten vias 809 may be deposited parallelly atop the silicon layer 807, and on either side of the germanium layer 808, and such that the pair of vias 509 possess equal thicknesses/heights, as shown in FIG. 8B. Finally, as shown, an aluminum electrode 810 may be interconnected to each tungsten via 809, such that to provide the Ge PD 801 with a metal contact for receiving a biasing voltage, as an example. Thus, as similarly mentioned previously above, the Ge PD 801 may provide the optical-to-electrical conversion capability for a propagating optical signal.

As shown in FIGS. 8A-8B, the silicon nitride launch waveguide 806, surrounded by top oxide layer cladding 805B, may be provided above, and centrally as shown, or with an offset (not shown), about a top 808B of the Ge layer 808 of the integrated Ge PD 801, such that a separation spacing 811 is created between the SiN waveguide 806 and the top 808B of the Ge layer 808, as an example. As shown in FIGS. 8A-8B, the SiN launch waveguide 806 may extend a length greater than that of the Si layer 807 along the silicon dioxide layer 805, as an example, such that to create a top-overlapping coupling portion/region 802, having a length, between the SiN layer 806 and the Ge layer 808. Thus, optical light 815 being launched into the SiN launch waveguide 806 may be evanescently coupled into the Ge PD 801 from the top, as an example.

As mentioned above, the Ge PD 801 may be configured such that to be classified as a lateral PD, as an example. As described previously when referring to FIGS. 5A-5B, the configuration of the diode implantations (not shown), the tungsten vias 809, and the interconnected electrodes 810 determines this classification. Thus, because the tungsten vias 809 are parallelly deposited atop the silicon layer 807, as shown, the Ge PD 801 may thus be classified as a lateral PD. Accordingly, as outlined above, the silicon nitride top-launch waveguide may accommodate either vertical PDs or lateral PDs, as desired, for evanescently coupling optical light into the PD, as an example. Thus, as outlined above and as shown in FIGS. 8A-8B, the silicon nitride launch waveguide 806 may be alternatively positioned above the Ge layer 806, rather than to the side, for evanescently coupling optical light into the integrated germanium photodetector 801.

It should be understood that the lateral Ge PD 801 shown in FIGS. 8A-8B may alternatively be provided with a tapered SiN side-launch waveguide (e.g., 406), such as that shown previously in FIGS. 4A-4B above. It should also be understood that the previously described advantages and benefits for the Ge PD 101 shown previously in FIGS. 1A-1B are maintained for the lateral Ge PD 801 shown in FIGS. 8A-8B. Accordingly, for example, because of the utilization of the SiN top-launch waveguide 806, the advantages of low propagation loss, visible light detection, and efficient light absorption also apply to the integrated Ge PD 801 of FIGS. 8A-8B. It should also be understood that the Ge PD 801 shown in FIGS. 8A-8B may also be connected with a reflector, such as that shown previously in FIGS. 6A, 6B, and 7. It should also be understood that, as mentioned previously in this disclosure above, the layers of the integrated germanium photodetector 801 may be constructed of alternative suitable materials, as desired.

Figure 9A:
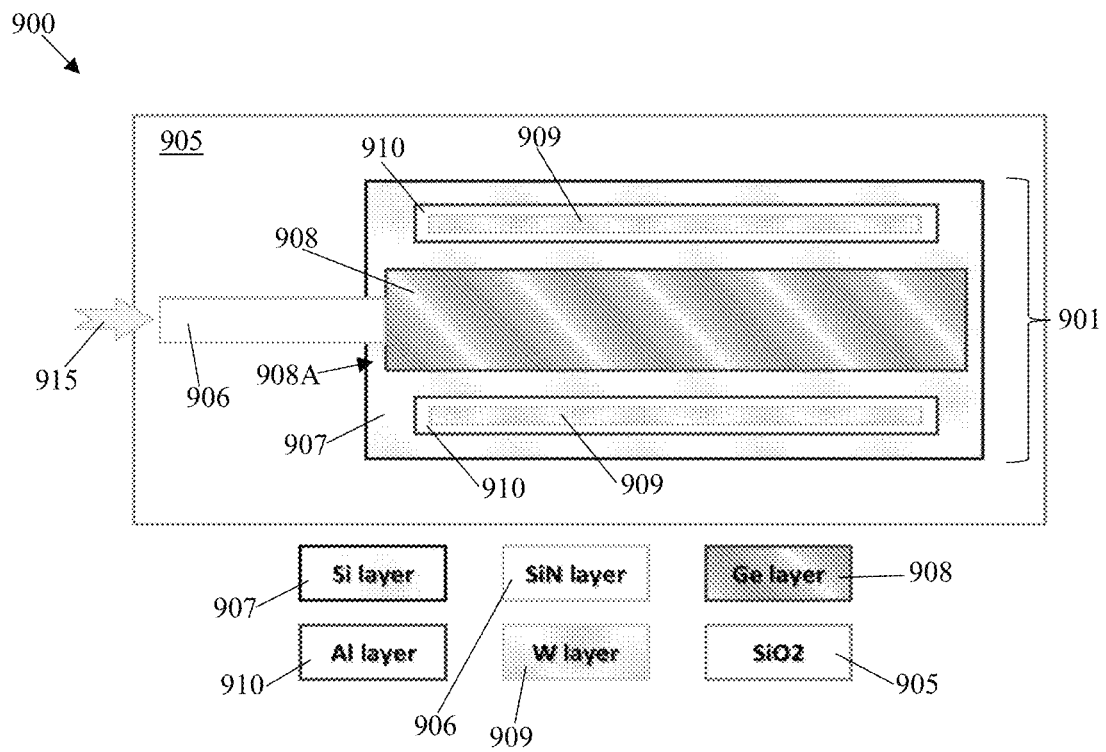
FIGS. 9A-9B are diagrams illustrating a top view and a front elevation cross-sectional view, respectively of an optical apparatus comprising a lateral integrated germanium photodetector and a butt-coupled silicon nitride launch waveguide, according to an aspect.
Figure 9B:
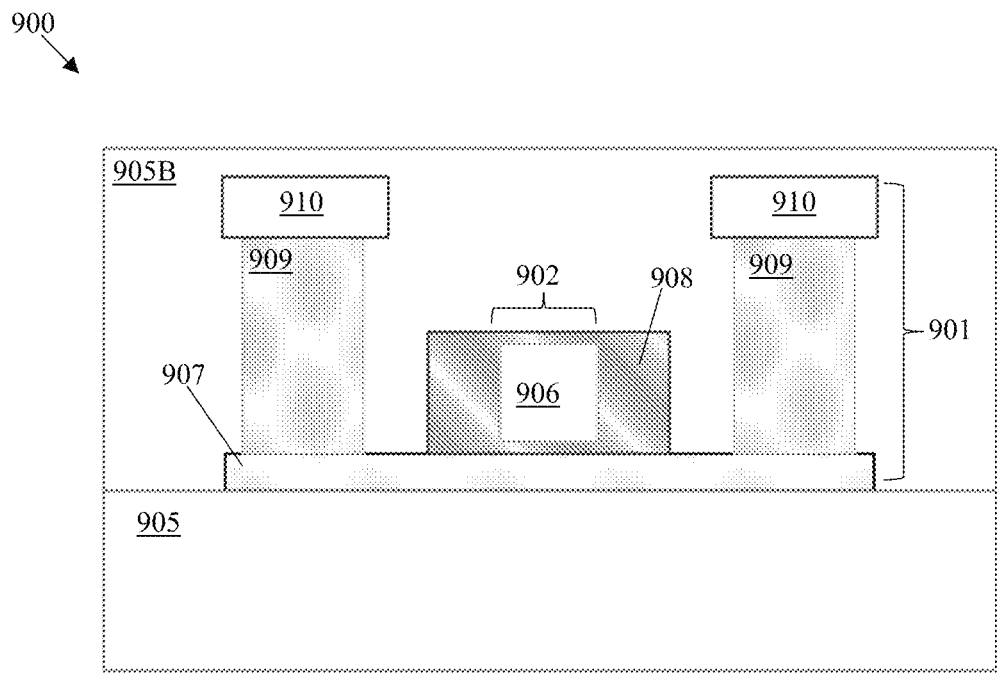

FIGS. 9A-9B are diagrams illustrating a top view and a front elevation cross-sectional view, respectively of an optical apparatus 900 comprising a lateral integrated germanium photodetector 901 and a butt-coupled silicon nitride launch waveguide 906, according to an aspect. As described throughout this disclosure above, the integrated germanium photodetector of the present invention may be provided as either a lateral PD or a vertical PD, based on the chosen configurations of the diode implantations (not shown), the vias (e.g., 809), and the interconnected metal contacts (e.g., 810). Additionally, as disclosed herein above, the silicon nitride waveguide (e.g., 706, 806) may be provided parallelly to a side or along a top of the germanium layer of the integrated germanium photodetector. As will be described in detail below, in an alternative embodiment 900 of the disclosed optical apparatus, a lateral Ge PD may be provided with a silicon nitride waveguide butt-coupled to the germanium layer, rather than to a side or along a top of it, for example.

As an example, let the integrated germanium photodetector 901 shown in FIGS. 9A-9B comprise the same exemplary elements as that shown previously in FIGS. 1A-1B. As such, the integrated Ge PD 901 may comprise a buried oxide layer 905 and a top oxide layer 905B, each constructed of silicon dioxide, as indicated, for example, the buried oxide layer 905 and the top oxide layer 905B being provided at a bottom or base of the integrated Ge PD 901 and surrounding the Ge PD 901, respectively. As shown, atop the bottom silicon dioxide layer 905, a silicon layer 907 may be provided, which may have a user-selected thickness, as shown in FIG. 9B. Furthermore, a germanium layer 908 may be provided centrally atop the Si layer 907, as shown, and may also comprise a user-selected thickness, as shown in FIG. 9B. As shown in FIGS. 9A-9B, a pair of tungsten vias 909 may be deposited parallelly atop the silicon layer 907, and on either side of the germanium layer 908, and such that the pair of vias 909 possess equal thicknesses/heights, as shown in FIG. 9B. Finally, as shown, an aluminum electrode 910 may be interconnected to each tungsten via 909, such that to provide the Ge PD 901 with a metal contact for receiving a biasing voltage, as an example. Thus, as similarly mentioned previously above, the Ge PD 901 may provide the optical-to-electrical conversion capability for a propagating optical signal.

As mentioned previously above in the Background, conventional germanium photodetectors may be provided with silicon launch waveguides butt-coupled to a front of the Ge PD, such that propagating optical light may be directly coupled into the Ge PD, as an example. As shown in FIGS. 9A-9B, the silicon nitride launch waveguide 906, surrounded by top oxide layer cladding 905B, may be butt-coupled directly to a front 908A of the Ge layer 908 of the integrated Ge PD 901, such that, as opposed to previous embodiments, a separation spacing no longer exists between the SiN waveguide 906 and the front 908a of the Ge layer 908, as an example. As another example, it should be noted that a small separation spacing or gap can sometimes exist, as long as the gap is appropriately chosen, to minimize optical loss. As shown in FIGS. 9A-9B, the SiN launch waveguide 906 no longer extends a length greater than that of the Si layer 907 along the silicon dioxide layer 905, as opposed to previous embodiments, since the SiN launch waveguide 906 is butt-coupled directly to the Ge layer 908.

As shown in FIG. 9B, the butt-coupling of the SiN launch waveguide 906 to the Ge layer 908 may create a coupling portion/region 902, through which optical light may be directly coupled into the Ge layer 908, for example. Thus, optical light 915 being launched into the SiN launch waveguide 906 may be directly coupled into the Ge PD 901 at the front 908A, as an example.

As mentioned above, the Ge PD 901 may be configured such that to be classified as a lateral PD, as an example. As described previously when referring to FIGS. 8A-8B, the configuration of the diode implantations (not shown), the tungsten vias 909, and the interconnected electrodes 910 determines this classification. Thus, because the tungsten vias 909 are parallelly deposited atop the silicon layer 907, as shown, the Ge PD 901 may thus be classified as a lateral PD. Accordingly, as outlined above, the butt-coupled silicon nitride waveguide may accommodate either vertical PDs or lateral PDs, as desired, for directly coupling optical light into the PD, as an example. Thus, as outlined above and as shown in FIGS. 9A-9B, the silicon nitride launch waveguide 906 may be alternatively butt-coupled to the Ge layer 906, rather than positioned to the front or side, for directly coupling optical light into the integrated germanium photodetector 801.

It should be understood that the lateral Ge PD 901 shown in FIGS. 9A-9B may alternatively be provided with a tapered SiN launch waveguide (e.g., 406) butt-coupled to the Ge layer 908, for example. It should also be understood that the previously described advantages and benefits for the Ge PD 101 shown previously in FIGS. 1A-1B are maintained for the lateral Ge PD 901 shown in FIGS. 9A-9B. Accordingly, for example, because of the utilization of the SiN launch waveguide 906, the advantages of low propagation loss, visible light detection, and efficient light absorption also apply to the integrated Ge PD 901 of FIGS. 9A-9B. It should also be understood that the Ge PD 901 shown in FIGS. 9A-9B may also be connected with a reflector, such as that shown previously in FIGS. 6A, 6B, and 7. It should also be understood that, as mentioned previously in this disclosure above, the layers of the integrated germanium photodetector 901 may be constructed of alternative suitable materials, as desired.

It should be understood that the Bragg grating reflector 730 of FIG. 7 described above may similarly be used with a lateral Ge PD. It should also be understood that the above-described approach of using a silicon nitride launch waveguide can be paired with an avalanched photodetector (APD) as well. It should also be understood that the silicon layer under the Ge layer may not have to have a uniform thickness; instead, as an example, the silicon layer can be formed into a trench, so that the Ge can be disposed into the trench. It should also be understood that the silicon handle of the SOI substrate is not shown in all the figures. It should also be understood that, with reference to the descriptions of layers being "deposited" or "provided" atop one another, such terms refer to the microfabrication/microprinting of the disclosed integrated Ge PD during the manufacturing process. It should also be understood that, because the launch waveguide described throughout this disclosure above is constructed of silicon nitride, the above-described approach is compatible with standard flow of silicon photonics foundries. It should also be understood that the silicon nitride launch waveguide disclosed herein may be provided in other shapes and/or configurations than those shown herein, such as butt-coupling the silicon nitride launch waveguide directly to the front of the integrated Ge PD (as shown in FIGS. 9A-9B), for example, or providing the silicon nitride launch waveguide to the left side (from a top view, such as in FIG. 5A, for example) of the integrated Ge PD.

It may be advantageous to set forth definitions of certain words and phrases used in this patent document. The term "couple" and its derivatives refer to any direct or indirect communication between two or more elements, whether or not those elements are in physical contact with one another. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Further, as used in this application, "plurality" means two or more. A "set" of items may include one or more of such items. Whether in the written description or the claims, the terms "comprising," "including," "carrying," "having," "containing," "involving," and the like are to be understood to be open-ended, i.e., to mean including but not limited to. Only the transitional phrases "consisting of" and "consisting essentially of," respectively, are closed or semi-closed transitional phrases with respect to claims.

If present, use of ordinal terms such as "first," "second," "third," etc., in the claims to modify a claim element does not by itself connote any priority, precedence or order of one claim element over another or the temporal order in which acts of a method are performed. These terms are used merely as labels to distinguish one claim element having a certain name from another element having a same name (but for use of the ordinal term) to distinguish the claim elements. As used in this application, "and/or" means that the listed items are alternatives, but the alternatives also include any combination of the listed items.

As used throughout this disclosure, the terms/phrases "optical signal," "optical test signal," "optical light," "laser light," "laser signal," and the like are used interchangeably. It should be understood that the aforementioned terms each individually and collectively refer to light, and more specifically, electromagnetic radiation.

Throughout this description, the aspects, embodiments or examples shown should be considered as exemplars, rather than limitations on the apparatus or procedures disclosed or claimed. Although some of the examples may involve specific combinations of method acts or system elements, it should be understood that those acts and those elements may be combined in other ways to accomplish the same objectives.

Acts, elements and features discussed only in connection with one aspect, embodiment or example are not intended to be excluded from a similar role(s) in other aspects, embodiments or examples.

Aspects, embodiments or examples of the invention may be described as processes, which are usually depicted using a flowchart, a flow diagram, a structure diagram, or a block diagram. Although a flowchart may depict the operations as a sequential process, many of the operations can be performed in parallel or concurrently. In addition, the order of the operations may be re-arranged. With regard to flowcharts, it should be understood that additional and fewer steps may be taken, and the steps as shown may be combined or further refined to achieve the described methods.

If means-plus-function limitations are recited in the claims, the means are not intended to be limited to the means disclosed in this application for performing the recited function, but are intended to cover in scope any equivalent means, known now or later developed, for performing the recited function.

Claim limitations should be construed as means-plus-function limitations only if the claim recites the term "means" in association with a recited function.

If any presented, the claims directed to a method and/or process should not be limited to the performance of their steps in the order written, and one skilled in the art can readily appreciate that the sequences may be varied and still remain within the spirit and scope of the present invention.

Although aspects, embodiments and/or examples have been illustrated and described herein, someone of ordinary skills in the art will easily detect alternate of the same and/or equivalent variations, which may be capable of achieving the same results, and which may be substituted for the aspects, embodiments and/or examples illustrated and described herein, without departing from the scope of the invention. Therefore, the scope of this application is intended to cover such alternate aspects, embodiments and/or examples. Hence, the scope of the invention is defined by the accompanying claims and their equivalents. Further, each and every claim is incorporated as further disclosure into the specification.

What is claimed is:

1. An optical apparatus comprising an integrated germanium photodetector associated with a silicon nitride launch waveguide and an optical reflector optically connected to a second end of the silicon nitride launch waveguide, the integrated germanium photodetector comprising:
   a silicon layer;
   a germanium layer disposed atop the silicon layer;
   a first and a second conductive vias, the first conductive via being disposed atop the germanium layer and the second conductive via being disposed parallelly atop the silicon layer; and
   a first and a second metal contacts interconnected to the first and the second conductive vias, respectively;
   wherein the silicon nitride launch waveguide extends over a length of the silicon layer, and such that to create a coupling region between the silicon nitride launch waveguide and the germanium layer, the optical reflector having:
   a 1×2 multimode interferometer (MMI) optically connected to the second end of the silicon nitride launch waveguide; and
   a silicon-nitride Sagnac ring optically connected to the 1×2 MMI;
   wherein, when an optical signal is launched into a first end of the silicon nitride launch waveguide, the optical signal is caused to propagate along the silicon nitride launch waveguide toward the integrated germanium photodetector, the optical signal being coupled into the integrated germanium photodetector at the coupling region, such that to be absorbed by the germanium layer.

2. The optical apparatus of claim 1, wherein, if any portion of the optical signal launched into the silicon nitride waveguide is not coupled into the integrated germanium photodetector at the coupling region, the portion of the launched optical signal is propagated through the reflector, the reflector causing the portion of the launched optical signal to be propagated back toward the integrated germanium photodetector, such that the portion is caused to be coupled into the integrated germanium photodetector at the coupling region, and thus absorbed by the germanium layer a second time.

3. The optical apparatus of claim 1, wherein the silicon nitride launch waveguide is disposed atop a silicon dioxide layer, the silicon dioxide layer being configured to be associated with an optical channel of an integrated photonics chip and to surround the integrated germanium photodetector, such that to provide cladding for the silicon nitride launch waveguide.

4. The optical apparatus of claim 3, wherein the silicon nitride launch waveguide is positioned parallelly to a side of the integrated germanium photodetector, such that a separation spacing is created between a side of the silicon nitride launch waveguide and a side of the germanium layer.

5. The optical apparatus of claim 1, wherein the first and the second conductive vias are constructed of tungsten.

6. The optical apparatus of claim 1, wherein the first and the second metal contacts are aluminum electrodes.

7. An optical apparatus comprising an integrated germanium photodetector associated with a silicon nitride launch waveguide and an optical reflector optically connected to a second end of the silicon nitride launch waveguide, the integrated germanium photodetector comprising:
   a silicon layer;
   a germanium layer disposed atop the silicon layer;
   a plurality of conductive vias, at least one conductive via of the plurality of conductive vias being disposed atop the germanium layer; and
   a plurality of metal contacts each interconnected to each of the plurality of conductive vias;
   wherein the silicon nitride launch waveguide extends over a length of the silicon layer, and such that to create a coupling region between the silicon nitride launch waveguide and the germanium layer, the optical reflector comprising:
   a silicon-nitride to silicon transition being formed by a tapered silicon-nitride layer optically connected to the second end of the silicon nitride launch waveguide and an inversely tapered silicon layer disposed below the tapered silicon-nitride layer;
   a 1×2 multimode interferometer (MMI) optically connected to the inversely tapered silicon layer; and
   a silicon Sagnac ring optically connected to the 1×2 MMI;
   wherein, when an optical signal is launched into the silicon nitride launch waveguide, the optical signal is caused to be coupled into the integrated germanium photodetector at the coupling region, such that to be absorbed by the germanium layer.

8. The optical apparatus of claim 7, wherein the silicon nitride launch waveguide is disposed atop a silicon dioxide layer, the silicon dioxide layer being configured to be associated with an optical channel of an integrated photonics chip and to surround the integrated germanium photodetector, such that to provide cladding for the silicon nitride launch waveguide.

9. The optical apparatus of claim 8, wherein the silicon nitride launch waveguide is positioned parallelly to a side of the integrated germanium photodetector on the silicon dioxide layer, such that a separation spacing is created between a side of the silicon nitride launch waveguide and the side of the integrated germanium photodetector.

10. The optical apparatus of claim 7, wherein the silicon nitride launch waveguide further comprises a first end opposite the second end of the silicon nitride launch waveguide, the first end having a first width and the opposite second end having a second width, the first width being selectively greater than the second width, such that the silicon nitride launch waveguide has a selectively tapered shape extending between the first end and the opposite second end.

11. The optical apparatus of claim 7, wherein the plurality of conductive vias are constructed of tungsten.

12. The optical apparatus of claim 7, wherein the plurality of metal contacts are aluminum electrodes.

13. A method of integrating an optical apparatus onto an optical waveguide of an integrated photonics chip, the optical waveguide having a buried oxide layer and a silicon layer atop the buried oxide layer, the method comprising the steps of:
  depositing a germanium layer having a thickness atop the silicon layer;
  providing a plurality of conductive vias, at least one conductive via of the plurality of conductive vias being disposed atop the silicon layer;
  interconnecting each of a plurality of metal contacts to each of the plurality of conductive vias;
  wherein the silicon layer, the germanium layer, the plurality of conductive vias, and the plurality of metal contacts form an integrated germanium photodetector;
  providing a silicon nitride launch waveguide in association with the germanium layer of the integrated germanium photodetector;
  providing an optical reflector disposed at a second end of the silicon nitride launch waveguide, the optical reflector comprising:
    a 1×2 multimode interferometer (MMI) optically connected to the second end of the silicon nitride launch waveguide; and
    a silicon-nitride Sagnac ring optically connected to the 1×2 MMI; and
  providing a top oxide layer configured to surround the integrated germanium photodetector, and such that to provide cladding for the silicon nitride launch waveguide.

14. The method of claim 13, wherein the silicon nitride launch waveguide is positioned parallelly adjacent to, and a selected distance away from, a side of the germanium layer, the silicon nitride launch waveguide selectively extending over a length of the silicon layer, such that at least a portion of the silicon nitride launch waveguide side-overlaps with at least a portion of the germanium layer, and such that to create a coupling region between the silicon nitride launch waveguide and the germanium layer.

15. The method of claim 13, wherein the silicon nitride launch waveguide is positioned above, and selectively extends over a length of, the germanium layer, and such that to create an overlapping coupling region between the silicon nitride launch waveguide and the germanium layer.

16. The method of claim 13, wherein the buried and the top oxide layers are constructed of silicon dioxide, the plurality of conductive vias are constructed of tungsten, and the plurality of metal contacts are aluminum electrodes.

17. The method of claim 13, wherein the silicon nitride launch waveguide is butt-coupled to a front of the germanium layer.

* * * * *